United States Patent
Ma et al.

(10) Patent No.: US 11,411,056 B2
(45) Date of Patent: Aug. 9, 2022

(54) DISPLAY PANEL AND DISPLAY DEVICE

(71) Applicant: Wuhan Tianma Micro-Electronics Co., Ltd., Wuhan (CN)

(72) Inventors: Yangzhao Ma, Wuhan (CN); Zhiqiang Xia, Wuhan (CN); Xingxing Yang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 16 days.

(21) Appl. No.: 16/840,068

(22) Filed: Apr. 3, 2020

(65) Prior Publication Data
US 2021/0159286 A1 May 27, 2021

(30) Foreign Application Priority Data
Nov. 27, 2019 (CN) .......................... 201911184050.9

(51) Int. Cl.
*H01L 27/32* (2006.01)
(52) U.S. Cl.
CPC ...... *H01L 27/3234* (2013.01); *H01L 27/3218* (2013.01); *H01L 27/3272* (2013.01); *H01L 27/3276* (2013.01)
(58) Field of Classification Search
CPC . H01L 27/3206–3227; G02F 1/133512; G02F 2201/52
See application file for complete search history.

(56) References Cited

U.S. PATENT DOCUMENTS

| | | | |
|---|---|---|---|
| 9,312,312 B1 | 4/2016 | Tsai et al. | |
| 2019/0165065 A1* | 5/2019 | Kong | .................. H01L 27/3246 |
| 2019/0258071 A1* | 8/2019 | Dong | ..................... G02B 30/27 |
| 2020/0124927 A1* | 4/2020 | Kim | ..................... G02F 1/13318 |
| 2020/0381649 A1* | 12/2020 | Yoo | ..................... H01L 27/3248 |
| 2020/0403043 A1* | 12/2020 | Xin | ..................... H01L 27/3283 |

FOREIGN PATENT DOCUMENTS

| | | |
|---|---|---|
| CN | 107122742 A | 9/2017 |
| CN | 107154417 A | 9/2017 |
| CN | 208622778 U | 3/2019 |
| CN | 110061014 A | 7/2019 |
| CN | 110189639 A | 8/2019 |
| TW | 201929219 A | 7/2019 |
| TW | 201939733 A | 10/2019 |

* cited by examiner

*Primary Examiner* — Eric K Ashbahian
(74) *Attorney, Agent, or Firm* — Anova Law Group, PLLC

(57) ABSTRACT

A display panel and a display device are provided in the present disclosure. The display panel includes a display region including a first display region and a photo-sensitive element disposing region. The photo-sensitive element disposing region includes a light-transmitting region and a light-blocking region. The display panel further includes a base substrate and a plurality of pixel units on the base substrate. The light-blocking region includes at least one pixel unit which includes a plurality of sub-pixels. Along a direction perpendicular to a plane of the base substrate, the light-blocking region at least includes a first convex arced edge.

16 Claims, 19 Drawing Sheets

DISPLAY PANEL AND DISPLAY DEVICE

CROSS-REFERENCE TO RELATED APPLICATION

This application claims the priority of Chinese Patent Application No. 201911184050.9, filed on Nov. 27, 2019, the content of which is incorporated herein by reference in its entirety.

TECHNICAL FIELD

The present disclosure generally relates to the field of display technology and, more particularly, relates to a display panel and a display device.

BACKGROUND

In order to realize capturing functions or the like, photo-sensitive elements may need to be disposed at the photo-sensitive disposing region of the display panel. External ambient light may be transmitted to the photo-sensitive elements through the photo-sensitive disposing region to implement capturing functions or the like. Images may be displayed at the photo-sensitive disposing region to implement full screen display. However, when the photo-sensitive elements are in operation, the external ambient light may diffract to generate stray light when passing through the photo-sensitive disposing region, thereby affecting normal operations of the photo-sensitive elements.

SUMMARY

One aspect of the present disclosure provides a display panel. The display panel includes a display region including a first display region and a photo-sensitive element disposing region, where the photo-sensitive element disposing region includes a light-transmitting region and a light-blocking region. The display panel further includes a base substrate and a plurality of pixel units on the base substrate. The light-blocking region includes at least one of the plurality of pixel units, and one of the plurality of pixel units includes a plurality of sub-pixels. Along a direction perpendicular to a plane of the base substrate, the light-blocking region at least includes a first convex arced edge.

Another aspect of the present disclosure provides a display device. The display device includes a display panel. The display panel includes a display region including a first display region and a photo-sensitive element disposing region, where the photo-sensitive element disposing region includes a light-transmitting region and a light-blocking region. The display panel further includes a base substrate and a plurality of pixel units on the base substrate. The light-blocking region includes at least one of the plurality of pixel units, and one of the plurality of pixel units includes a plurality of sub-pixels. Along a direction perpendicular to a plane of the base substrate, the light-blocking region at least includes a first convex arced edge. The display device further includes a photo-sensitive element at the photo-sensitive element disposing region, where the photo-sensitive element is on a backlight side of the display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
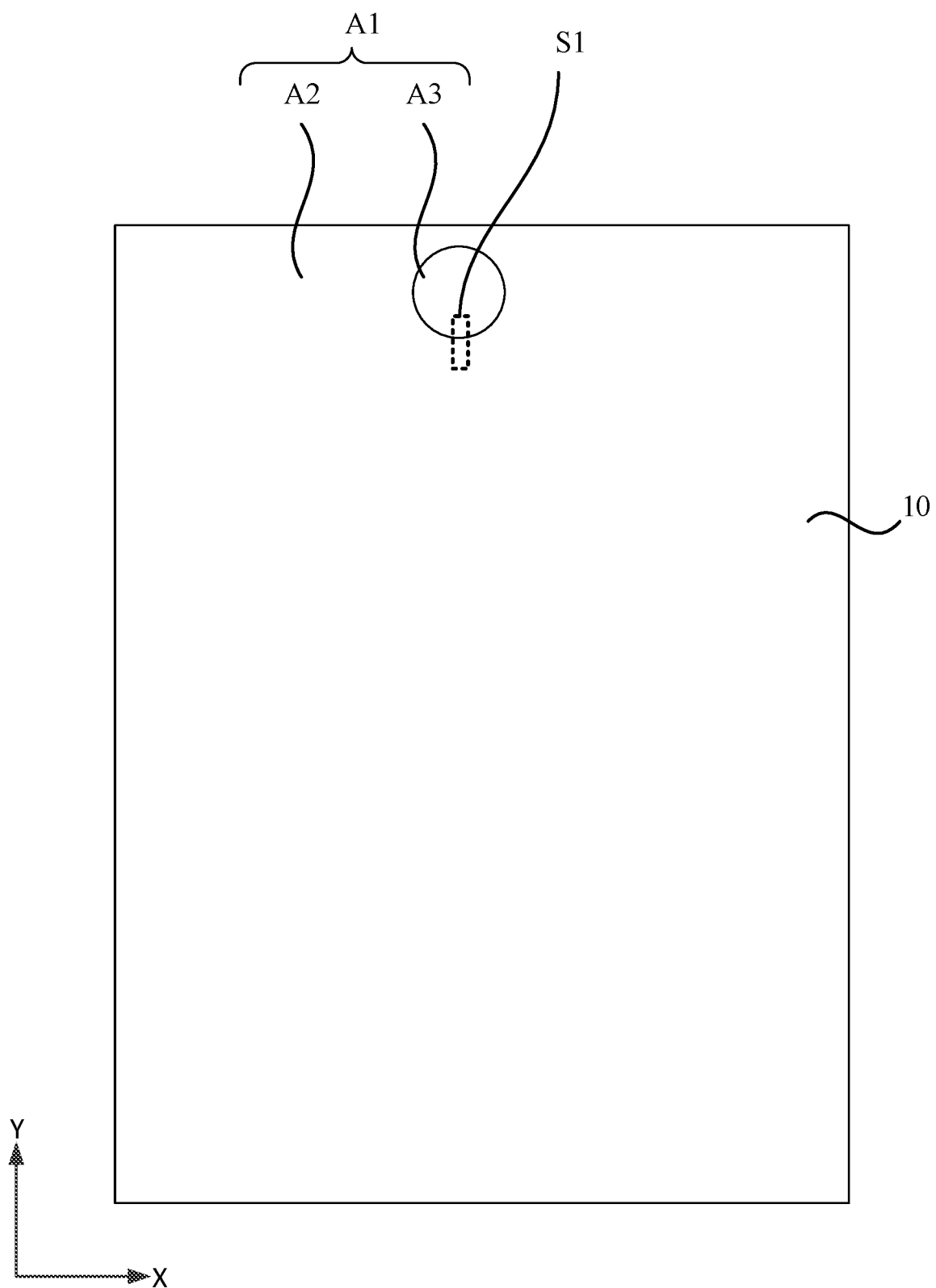
FIG. 1 illustrates a structural top view of a display panel according to embodiments of the present disclosure.

The present disclosure may be further described in detail below with reference to the drawings and embodiments. It may be understood that the embodiments described herein may merely be used to illustrate the present disclosure, rather than limiting the present disclosure. In addition, it should be noted that, for convenience of description, merely partial but not all structures related to the present disclosure are shown in the drawings.

Figure 2:
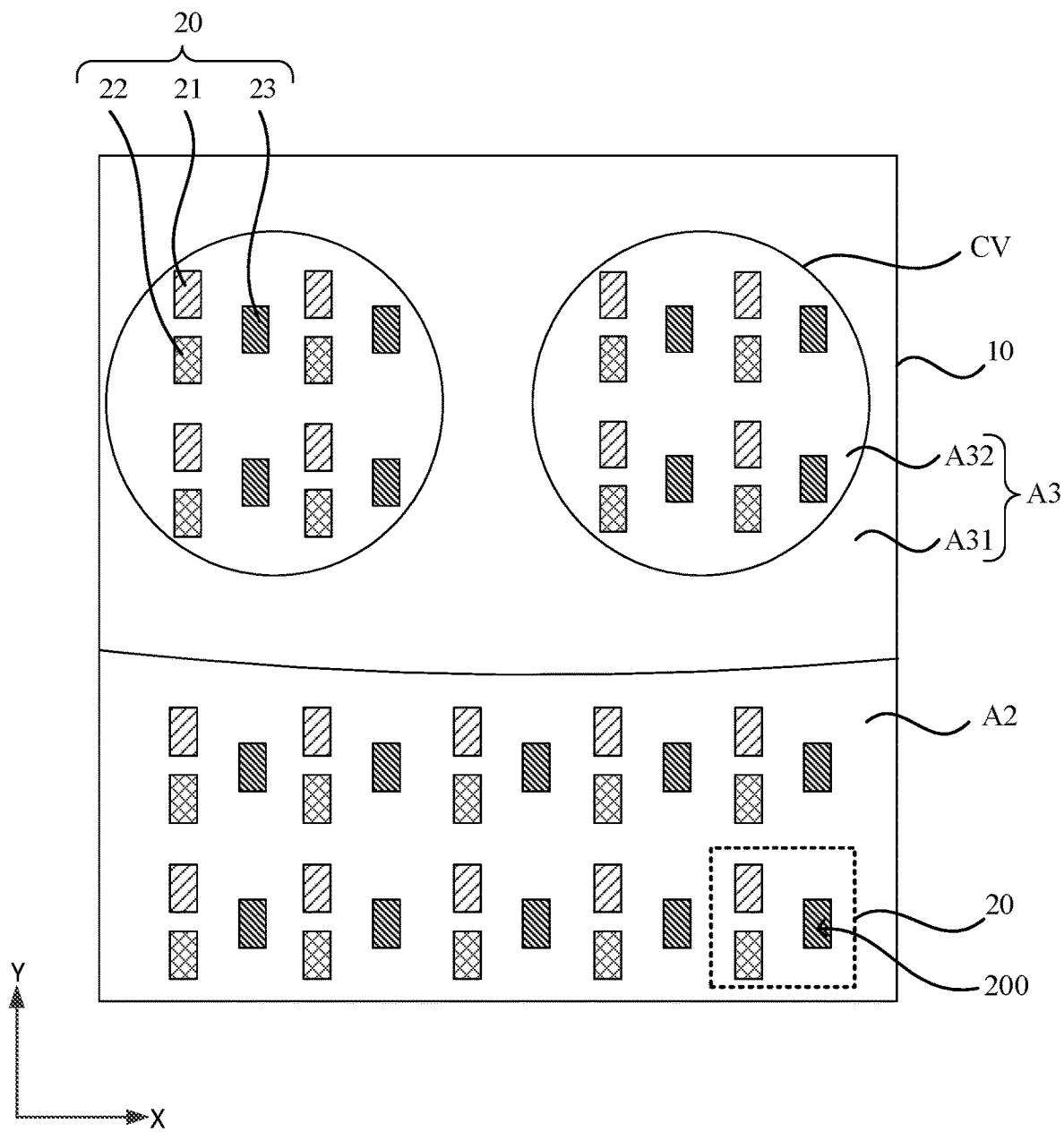
FIG. 2 illustrates an enlarged structural schematic of a region S1 in FIG. 1.

FIG. 1 illustrates a structural top view of a display panel according to the embodiments of the present disclosure, and FIG. 2 illustrates an enlarged structural schematic of a region S1 in FIG. 1. Referring to FIG. 1 and FIG. 2, the display panel may include a display region A1. The display region A1 may include a first display region A2 and a photo-sensitive element disposing region A3. The photo-sensitive element disposing region A3 may include a light-transmitting region A31 and a light-blocking region A32. When irradiating onto the photo-sensitive element disposing region A3, external ambient light may pass through the light-transmitting region A31 in the photo-sensitive element disposing region A3 and irradiate onto the backlight side of the display panel. The display panel may include a base substrate 10 and a plurality of pixel units 20 on the base substrate 10, where the light-blocking region A32 may include at least on pixel unit 20, and the pixel unit 20 may include a plurality of sub-pixels 200. Along a direction perpendicular to the plane of the base substrate 10, the light-blocking region A32 may at least include a first convex arced edge CV.

In the display panel provided by the embodiments of the present disclosure, since the pixel units in the photo-sensitive element disposing region are in the light-blocking region, the light irradiated to a gap between two adjacent sub-pixels may be blocked when external ambient light is irradiated onto the photo-sensitive element disposing region, thereby preventing diffraction at the gap between two adjacent subpixels. Furthermore, the light-blocking region may at least include the first outer convex curved edge, that is, a portion of the outer edge of the light-blocking region may be convex-curved. It may be understood that, if a boundary between the light-blocking region and the light-transmitting region is a straight line, the light energy may be distributed on two sides of the straight line to form a plurality of light and dark stripes in parallel with the extending direction of the straight line. If the boundary between the light-blocking region and the light-transmitting region is an arc, the arc may be equivalent to a plurality of straight lines with different extending directions. Therefore, the light energy may be distributed in a plurality of different directions, thereby weakening the diffraction phenomenon. In the embodiments of the present disclosure, the light-blocking region may at least include the first convex arced edge, thereby reducing the diffraction phenomenon of the photo-sensitive element disposing region. Furthermore, the first convex arced edge may also reserve sufficient space for disposing the pixel units at the light-blocking region, thereby facilitating the disposing of the pixel units at the light-blocking region. Optionally, when the external ambient light is irradiated onto the photo-sensitive element disposing region, the light may not pass through the light-blocking region. Along the direction perpendicular to the plane of the base substrate, the gap between two adjacent sub-pixels may be covered by the light-blocking region.

Optionally, referring to FIG. 1 and FIG. 2, along the direction perpendicular to the plane of the base substrate 10, the edge contour of the light-blocking region A32 may be a circle. Any position of the circle may be a convex arc (i.e., the first convex arced edge CV); in addition, since the curvature at any position of the circle is same, the light energy may be evenly distributed in the 360° direction, thereby weakening the diffraction phenomenon. In other embodiments, along the direction perpendicular to the plane of the base substrate 10, the edge contour of the light-blocking region A32 may also be an ellipse, or multiple non-elliptical arcs. The multiple non-elliptical arcs may include a plurality of arced lines which are not elliptical arcs. The arced lines included by the multiple non-elliptical arcs may be, for example, circular arcs. The elliptical arc may refer to a segment of an arc in the ellipse, and the circular arc may refer to a segment of an arc in a circle. Along the direction perpendicular to the plane of the base substrate 10, the edge contour of the light-blocking region A32 may be any one of the circle, the ellipse, and the multiple non-elliptical arcs.

Figure 3:
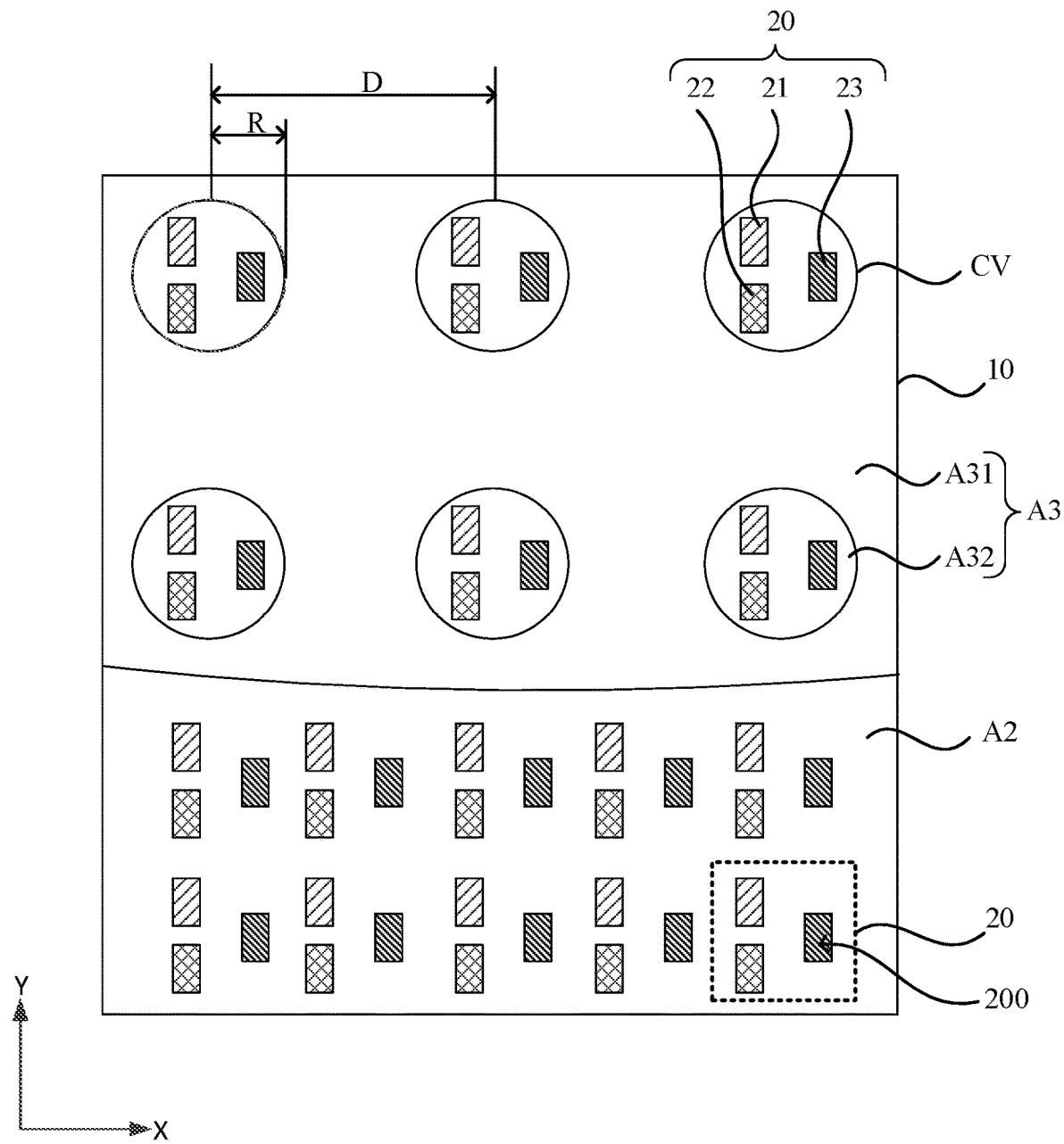
FIG. 3 illustrates a partial structural top view of another display panel according to embodiments of the present disclosure.

FIG. 3 illustrates a partial structural top view of another display panel according to the embodiments of the present disclosure. Referring to FIG. 3, one pixel unit 20 may be disposed in each light-blocking region A32. Optionally, a pixel density in the photo-sensitive element disposing region A3 may be less than a pixel density in the first display region A2, the pixel density in the photo-sensitive element disposing region A3 may be relatively low, and the light-transmitting region A31 in the photo-sensitive element disposing region A3 may not display images. If the plurality of pixel units 20 are disposed in each light-blocking region A32, the plurality of pixel units 20 may have relatively high luminous brightness, resulting in grainy images displayed in the photo-sensitive element disposing region A3. In the embodiments of the present disclosure, one pixel unit 20 may be disposed in each light-blocking region A32 and have relatively low luminous brightness, which may reduce grainy images displayed in the photo-sensitive element disposing region A3. It should be noted that, in other embodiments, the plurality of pixel units 20 may be disposed in each light-blocking region A32, which may not be limited in the present disclosure.

Optionally, referring to FIG. 3, the plurality of pixel units 20 may be arranged in rows and columns in the photo-sensitive element disposing region A3. In the light-blocking region A32, a pixel unit 20 may include a first sub-pixel 21, a second sub-pixel 22, and a third sub-pixel 23, which may be arranged in a delta shape. In the embodiments of the present disclosure, the first sub-pixel 21, the second sub-pixel 22, and the third sub-pixel 23 may be arranged in the delta shape. Along the direction perpendicular to the plane of the base substrate 10, the first sub-pixel 21, the second sub-pixel 22, and the third sub-pixel 23 may be compactly arranged; the first sub-pixel 21, the second sub-pixel 22, and the third sub-pixel 23 may approximately occupy a region inscribed of a circle or ellipse; and the first sub-pixel 21, the second sub-pixel 22, and the third sub-pixel 23 may occupy a relatively small area. Therefore, the area of the light-blocking region A32 may be reduced, and the area of the light-transmitting region A31 may be increased, thereby increasing the amount of external ambient light passing through the light-transmitting region A31. It should be noted that the edge contour of the light-blocking region A32 is the circle in FIG. 3 for illustration, which may not be limited in the present disclosure, as long as the light-blocking region A32 includes at least the first convex arched edge CV along the direction perpendicular to the plane of the base substrate 10. Optionally, the first sub-pixel 21, the second sub-pixel 22, and the third sub-pixel 23 may respectively be one of a red sub-pixel, a green sub-pixel, and a blue sub-pixel, and may have different colors.

Optionally, referring to FIG. 3, in a same pixel unit 20, the first sub-pixel 21 and the second sub-pixel 22 may be in a same column, and the first sub-pixel 21 and the third sub-pixel 23 may be in different columns.

In one embodiment, referring to FIG. 3, a X direction is a row direction, and a Y direction is a column direction. Along the X direction, the third sub-pixel 23 may overlap the first sub-pixel 21 and the second sub-pixel 22. Along the Y direction, the first sub-pixel 21 and the third sub-pixel 23 may be in different columns, the second sub-pixel 22 and the third sub-pixel 23 may be in different columns, and the first sub-pixel 21 and the second sub-pixel 22 may be in a same column. For each of the first sub-pixel 21, the second sub-pixel 22, and the third sub-pixel 23, a length along the Y direction may be greater than a length along the X direction. Optionally, along the Y direction, the first sub-pixel 21, the second sub-pixel 22, and the third sub-pixel 23 may have a same length.

Optionally, referring to FIG. 3, the plurality of light-blocking regions A32 may be arranged in rows and columns in the photo-sensitive element disposing region A3. Along the row direction and the column direction, a distance between the geometric centers of two adjacent light-blocking regions A32 is D. Along the direction perpendicular to the plane of the base substrate 10, the edge contour of the light-blocking region A32 is a circle, and the radius of the circle is R, where R and D satisfy $0<2R<D<6R$. If $D<2R$, two adjacent light-blocking regions A32 may be connected to each other as one light-blocking region, which may result in that the edge contour of the light-blocking region A32 may not be a circle. If $D>6R$, the distance between two adjacent light-blocking regions A32 may be too large, which may result that the disposing density of the light-blocking regions A32 is too low, and the display uniformity of the light-blocking regions A32 is not desirable, thereby affecting the display performance. In the embodiments of the present disclosure, R and D may satisfy $0<2R<D<6R$, thereby ensuring the edge contour of the light-blocking region A32 to be the circle, and also ensuring the photo-sensitive element disposing region A3 to have desirable display uniformity.

Figure 4:
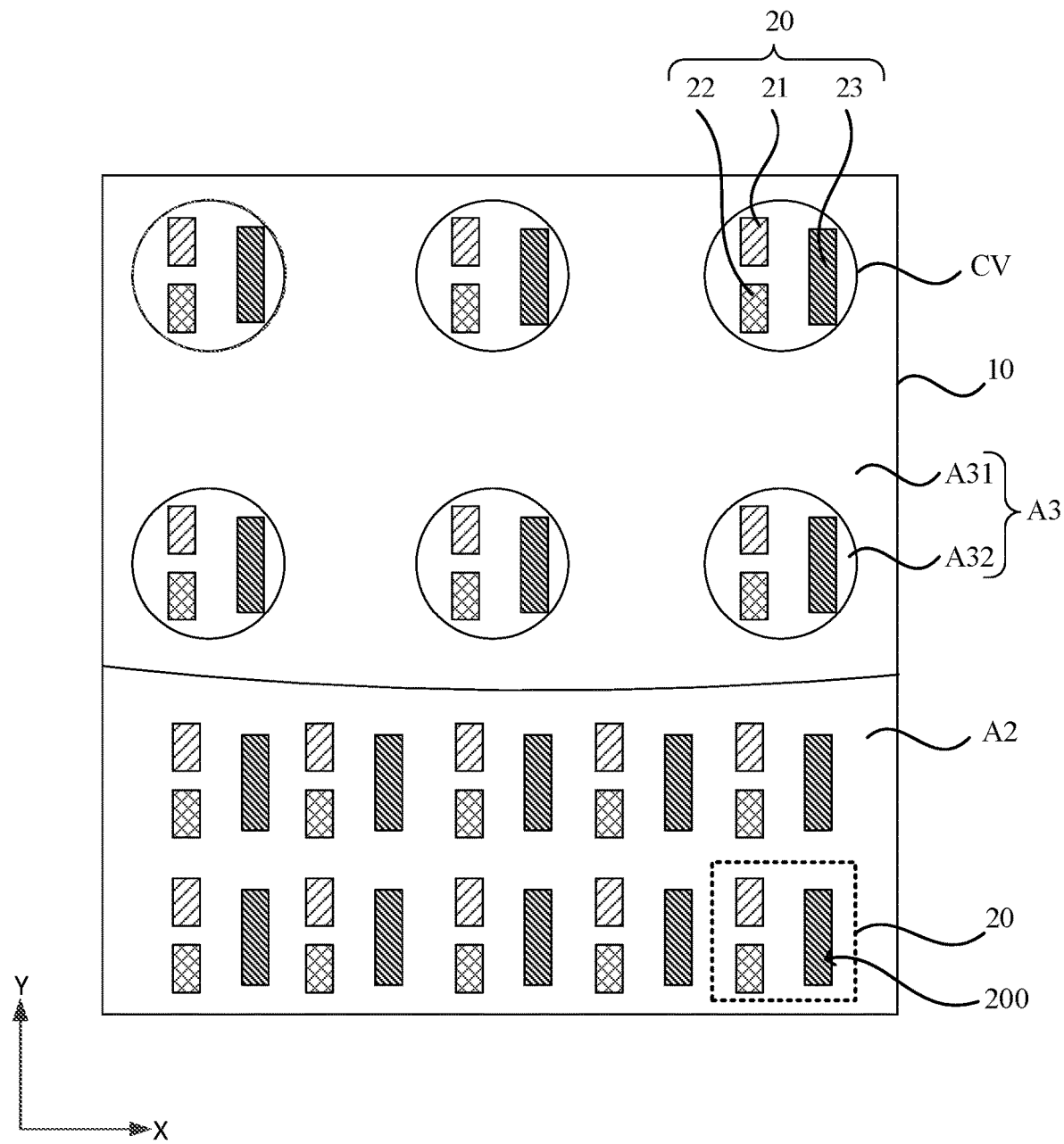
FIG. 4 illustrates a partial structural top view of another display panel according to embodiments of the present disclosure.

FIG. 4 illustrates a partial structural top view of another display panel according to the embodiments of the present disclosure. Referring to FIG. 4, along the X direction, the third sub-pixel 23 may overlap the first sub-pixel 21 and the second sub-pixel 22. Along the Y direction, the first sub-pixel 21 and the third sub-pixel 23 may be in different columns, the second sub-pixel 22 and the third sub-pixel 23 may be in different columns, and the first sub-pixel 21 and the second sub-pixel 22 may be in a same column. For each of the first sub-pixel 21, the second sub-pixel 22, and the third sub-pixel 23, the length along the Y direction may be greater than the length along the X direction. Along the Y direction, the first sub-pixel 21 and the second sub-pixel 22 may have a same length, the length of the third sub-pixel 23 may be greater than the length of the first sub-pixel 21, and the length of the third sub-pixel 23 may be greater than the length of the second sub-pixel 22.

Figure 5:
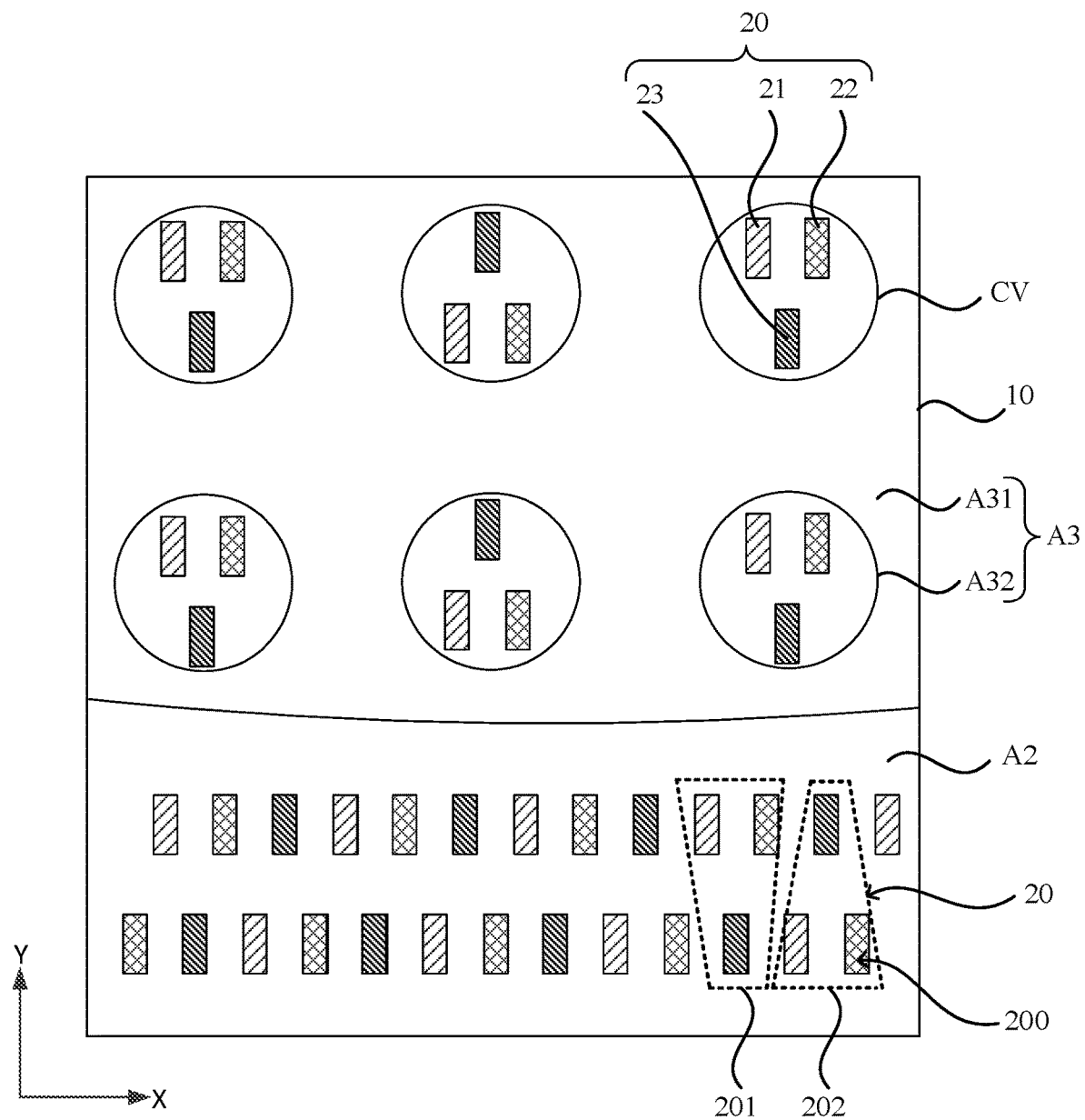
FIG. 5 illustrates a partial structural top view of another display panel according to embodiments of the present disclosure.

FIG. 5 illustrates a partial structural top view of another display panel according to the embodiments of the present disclosure. Referring to FIG. 5, the sub-pixels 200 in odd rows and the sub-pixels 200 in even rows may be staggeredly arranged in the display region A1. In a same pixel unit 20, the first sub-pixel 21 and the second sub-pixel 22 may be in a same row, and the first sub-pixel 21 and the third sub-pixel 23 may be in different rows.

Referring to FIG. 5, along the X direction, the first sub-pixel 21 and the second sub-pixel 22 may be in a same row, the first sub-pixel 21 and the third sub-pixel 23 may be in different rows, and the second sub-pixel 22 and the third sub-pixel 23 may be in different rows. For each of the first sub-pixel 21, the second sub-pixel 22, and the third sub-pixel 23, the length along the Y direction may be greater than the length along the X direction. Optionally, along the direction perpendicular to the plane of the base substrate 10, the edge contour of the light-blocking region A32 may be a circle.

Figure 6:
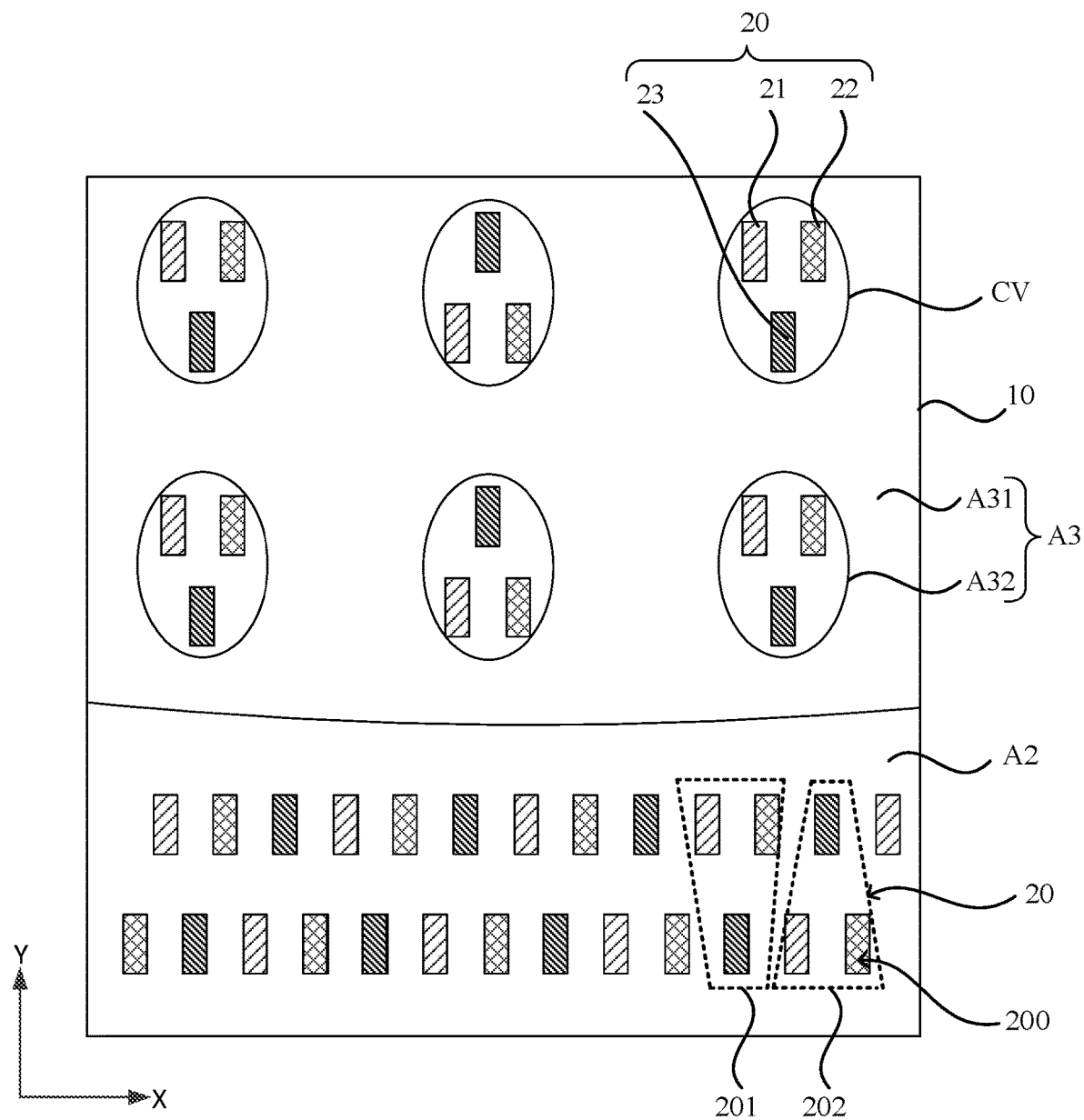
FIG. 6 illustrates a partial structural top view of another display panel according to embodiments of the present disclosure.

FIG. 6 illustrates a partial structural top view of another display panel according to the embodiments of the present disclosure. Referring to FIG. 6, along the direction perpendicular to the plane of the base substrate 10, the edge contour of the light-blocking region A32 may be an ellipse. The minor axis of the ellipse is in parallel with the row direction, and the major axis of the ellipse is in parallel with the column direction. In the embodiments of the present disclosure, in a same pixel unit 20, the first sub-pixel 21 and the second sub-pixel 22 may be in a same row, and the first sub-pixel 21 and the third sub-pixel 23 may be in different rows; and along the direction perpendicular to the plane of the base substrate 10, for the area jointly occupied by the first sub-pixel 21, the second sub-pixel 22, and the third sub-pixel 23, the length along the row direction (the X direction) may be less than the length along the column direction (the Y direction). Therefore, the edge contour of the light-blocking region A32 is an ellipse, and the minor axis of the ellipse is in parallel with the row direction, thereby enabling the arrangement manner of the first sub-pixel 21, the second sub-pixel 22, and the third sub-pixel 23 to match the shape of the light-blocking region A32, which may reduce the area of the light-blocking region A32, increase the area of the light-transmitting region A31, and increase the amount of external ambient light passing through the light-transmitting region A31.

Figure 7:
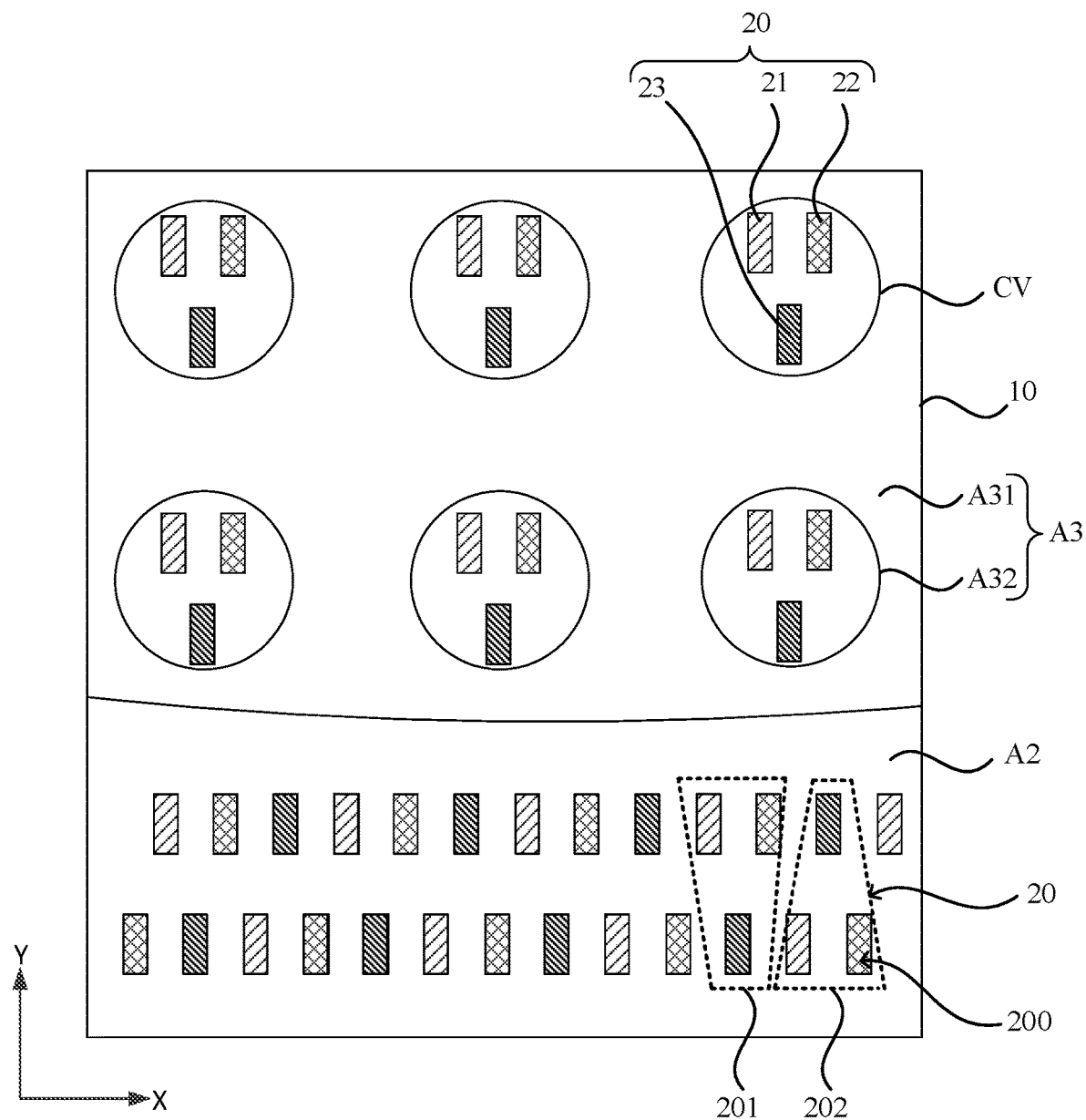
FIG. 7 illustrates a partial structural top view of another display panel according to embodiments of the present disclosure.

FIG. 7 illustrates a partial structural top view of another display panel according to the embodiments of the present disclosure. Referring to FIG. 7, the third sub-pixels 23 in different pixel units 20 may be in a same row in the photo-sensitive element disposing region A3. In the embodiments of the present disclosure, the third sub-pixels 23 in different pixel units 20 may be in a same row, and the first sub-pixel 21 and the second sub-pixel 22 may be in a same row. That is, in the plurality of pixel units 20 in the same row, all first sub-pixels 21 may be in a same row, all second sub-pixels 22 may be in a same row, and all third sub-pixels 23 may be in a same row, which may be advantageous to display straight lines and avoid jaggy phenomenon when displaying straight lines.

In one embodiment, referring to FIG. 7, the first display region A2 may include first pixel units 201 and the second pixel units 202 which are arranged alternately along the X direction. In the first pixel unit 201 and the second pixel unit 202, the first sub-pixel 21 and the second sub-pixel 22 may be in a same row, and the first sub-pixel 21 and the third sub-pixel 23 may be in different rows. In a row of pixel units in the first display region A2, the plurality of first sub-pixels 21 may be respectively located in two rows, the plurality of second sub-pixels 22 may be respectively located in two rows, and the plurality of third sub-pixels 23 may be respectively located in two rows. A row of sub-pixels 200 in the first display region A2 may include the first sub-pixels 21, the second sub-pixels 22, and the third sub-pixels 23. In a row of pixel units 20 in the photo-sensitive element disposing region A3, the first sub-pixels 21 in different pixel units 20 may be in a same row, the second sub-pixels 22 in different pixel units 20 may be in a same row, and the third sub-pixels 23 in different pixel units 20 may be in a same row, which may be advantageous to display straight lines and avoid jaggy phenomenon when displaying straight lines.

Figure 8:
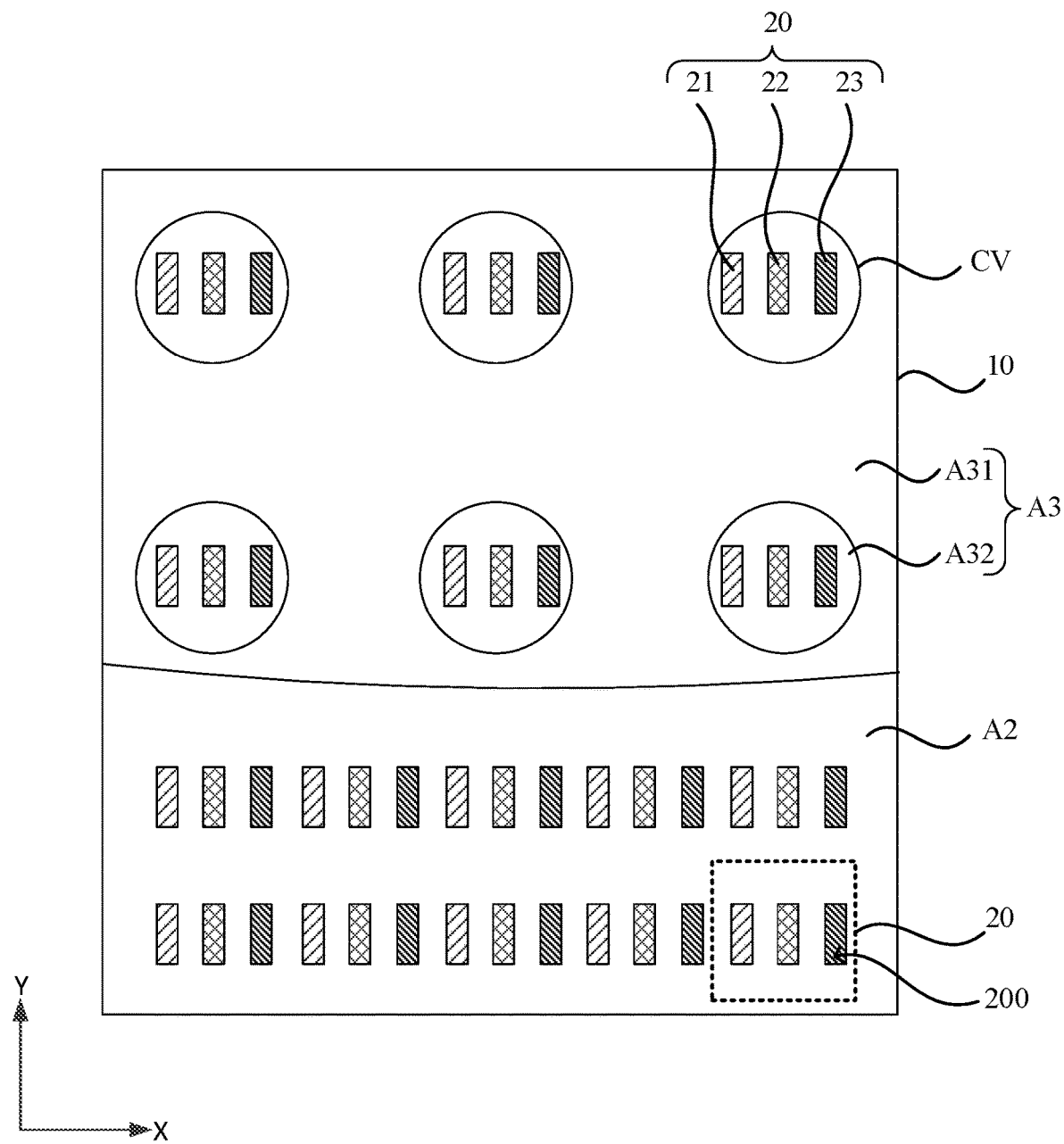
FIG. 8 illustrates a partial structural top view of another display panel according to embodiments of the present disclosure.

FIG. 8 illustrates a partial structural top view of another display panel according to the embodiments of the present disclosure. Referring to FIG. 8, the plurality of pixel units 20 may be arranged in rows and columns in the photo-sensitive element disposing region A3. In the light-blocking region A32, the pixel unit 20 may include the first sub-pixel 21, the second sub-pixel 22, and the third sub-pixel 23 which are arranged in the row direction, and the first sub-pixel 21, the second sub-pixel 22, and the third sub-pixel 23 may be in a same row. It should be noted that the edge contour of the light-blocking region A32 in FIG. 8 is the circle for illustration, which may not be limited in the present disclosure, as long as the light-blocking region A32 includes at least the first convex arched edge CV along the direction perpendicular to the plane of the base substrate 10. Optionally, the arrangement manner of the sub-pixels 200 in the pixel units 20 in the first display region A2 may be the same as the arrangement manner of the sub-pixels 200 in the pixel units 20 in the photo-sensitive element disposing region A3.

Figure 9:
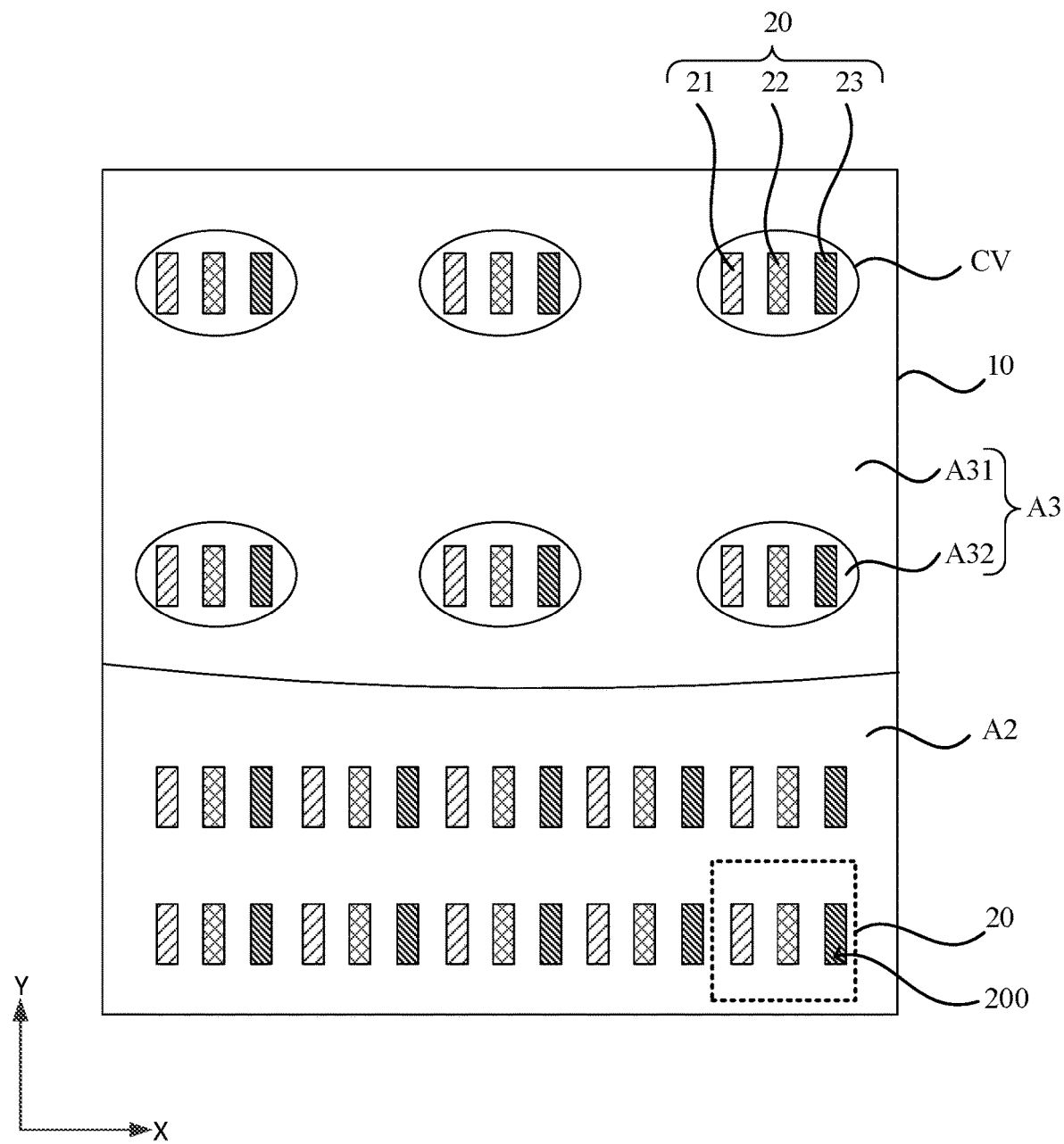
FIG. 9 illustrates a partial structural top view of another display panel according to embodiments of the present disclosure.

FIG. 9 illustrates a partial structural top view of another display panel according to the embodiments of the present disclosure. Referring to FIG. 9, along the direction perpendicular to the plane of the base substrate 10, the edge contour of the light-blocking region A32 may be an ellipse. The major axis of the ellipse may be in parallel with the row direction, and the minor axis of the ellipse may be in parallel with the column direction. In the embodiments of the present disclosure, in a same pixel unit 20, the first sub-pixel 21, the second sub-pixel 22, and the third sub-pixel 23 may be arranged in the row direction; and along the direction perpendicular to the plane of the base substrate 10, for the area jointly occupied by the first sub-pixel 21, the second sub-pixel 22, and the third sub-pixel 23, the length along the row direction (the X direction) may be greater than the length along the column direction (the Y direction). Therefore, the edge contour of the light-blocking region A32 may be an ellipse, and the major axis of the ellipse may be in parallel with the row direction, thereby enabling the arrangement manner of the first sub-pixel 21, the second sub-pixel 22, and the third sub-pixel 23 to match the shape of the light-blocking region A32, which may reduce the area of the light-blocking region A32, increase the area of the light-transmitting region A31, and increase the amount of external ambient light passing through the light-transmitting region A31. Optionally, the arrangement manner of the sub-pixels 200 in the pixel units 20 in the first display region A2 may be the same as the arrangement manner of the sub-pixels 200 in the pixel units 20 in the photo-sensitive element disposing region A3.

Figure 10:
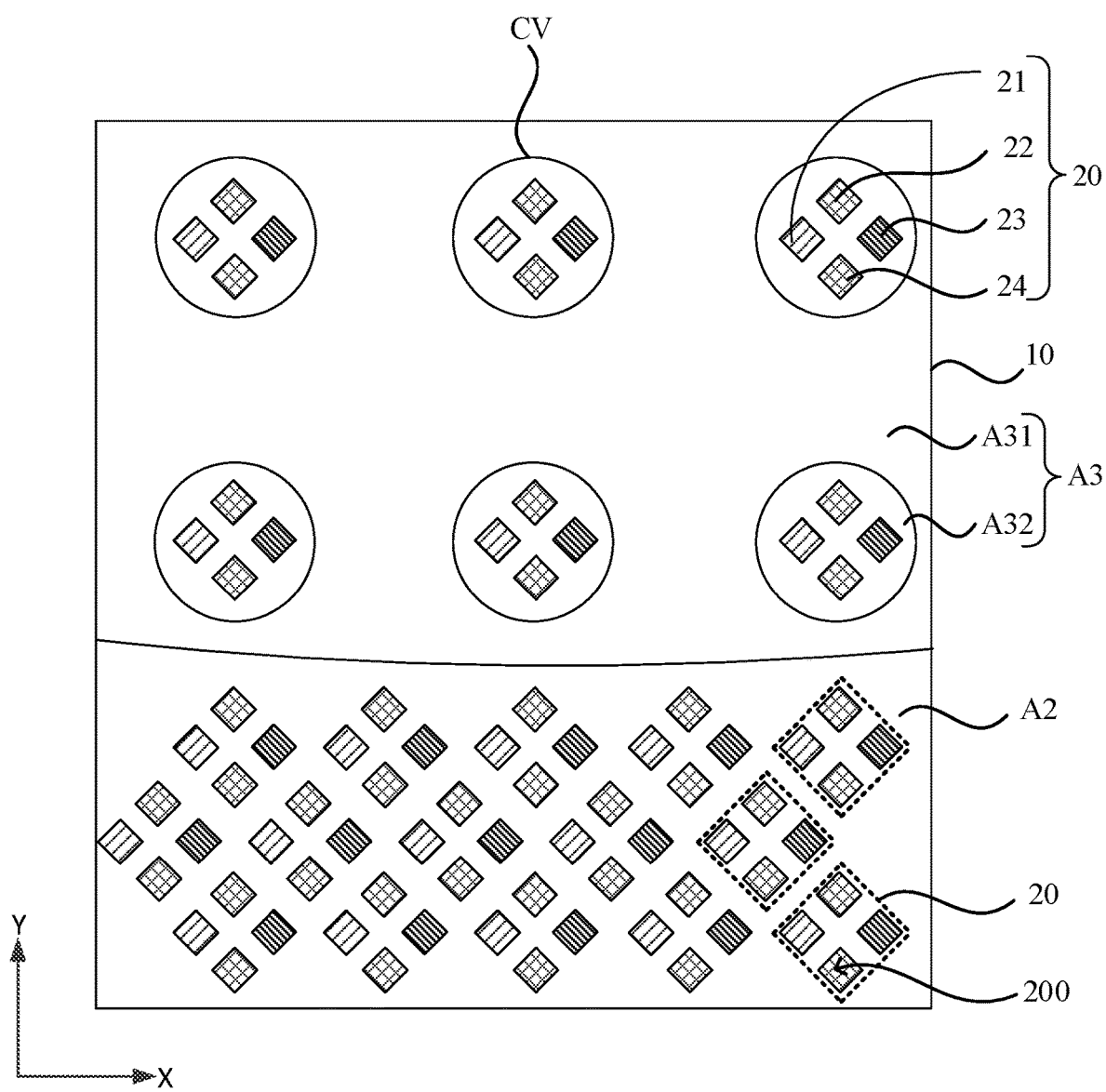
FIG. 10 illustrates a partial structural top view of another display panel according to embodiments of the present disclosure.

FIG. 10 illustrates a partial structural top view of another display panel according to the embodiments of the present disclosure. Referring to FIG. 10, the plurality of pixel units 20 may be arranged in rows and columns in the photo-sensitive element disposing region A3. In the light-blocking region A32, the pixel unit 20 may include the first sub-pixel 21, the second sub-pixel 22, the third sub-pixel 23, and a fourth sub-pixel 24. In a same pixel unit 20, the first sub-pixel 21 and the third sub-pixel 23 may be in a same row; any two of the first sub-pixel 21, the second sub-pixel 22, and the fourth sub-pixel 24 may be in different rows; the second sub-pixel 22 and the fourth sub-pixel 24 may be in a same column; and any two of the first sub-pixel 21, the second sub-pixel 22, and the third sub-pixel 23 may be in different columns. It should be noted that the edge contour of the light-blocking region A32 in FIG. 10 is the circle for illustration, which may not be limited in the present disclosure, as long as the light-blocking region A32 includes at least the first convex arched edge CV along the direction perpendicular to the plane of the base substrate 10.

In one embodiment, referring to FIG. 10, the second sub-pixel 22 and the fourth sub-pixel 24 may have a same emitting color, and any two of the first sub-pixel 21, the second sub-pixel 22, and the third sub-pixel 23 may have different emitting colors. The first sub-pixel 21, the second sub-pixel 22, the third sub-pixel 23, and the fourth sub-pixel 24 may form a 2×2 array, and angles between the row direction of the 2×2 array and each of the X direction and Y direction may both be 45°. The pixel units 20 in odd rows and the pixel units 20 in even rows may be staggeredly arranged in the first display region A2. Optionally, the first sub-pixel 21, the second sub-pixel 22, and the third sub-pixel 23 may respectively be one of the red sub-pixel, the green sub-pixel, and the blue sub-pixel, and may have different colors.

Figure 11:
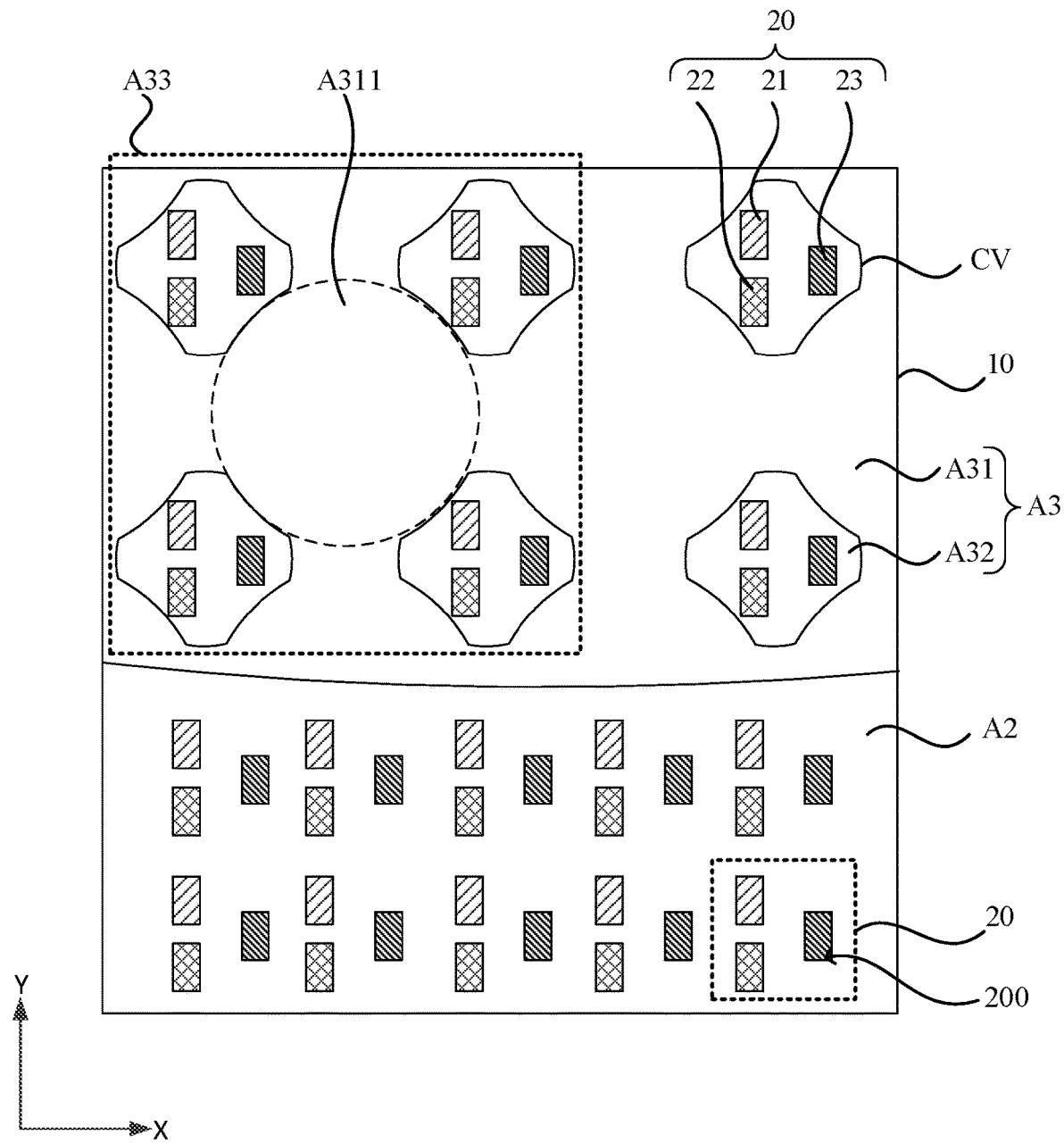
FIG. 11 illustrates a partial structural top view of another display panel according to embodiments of the present disclosure.
Figure 12:
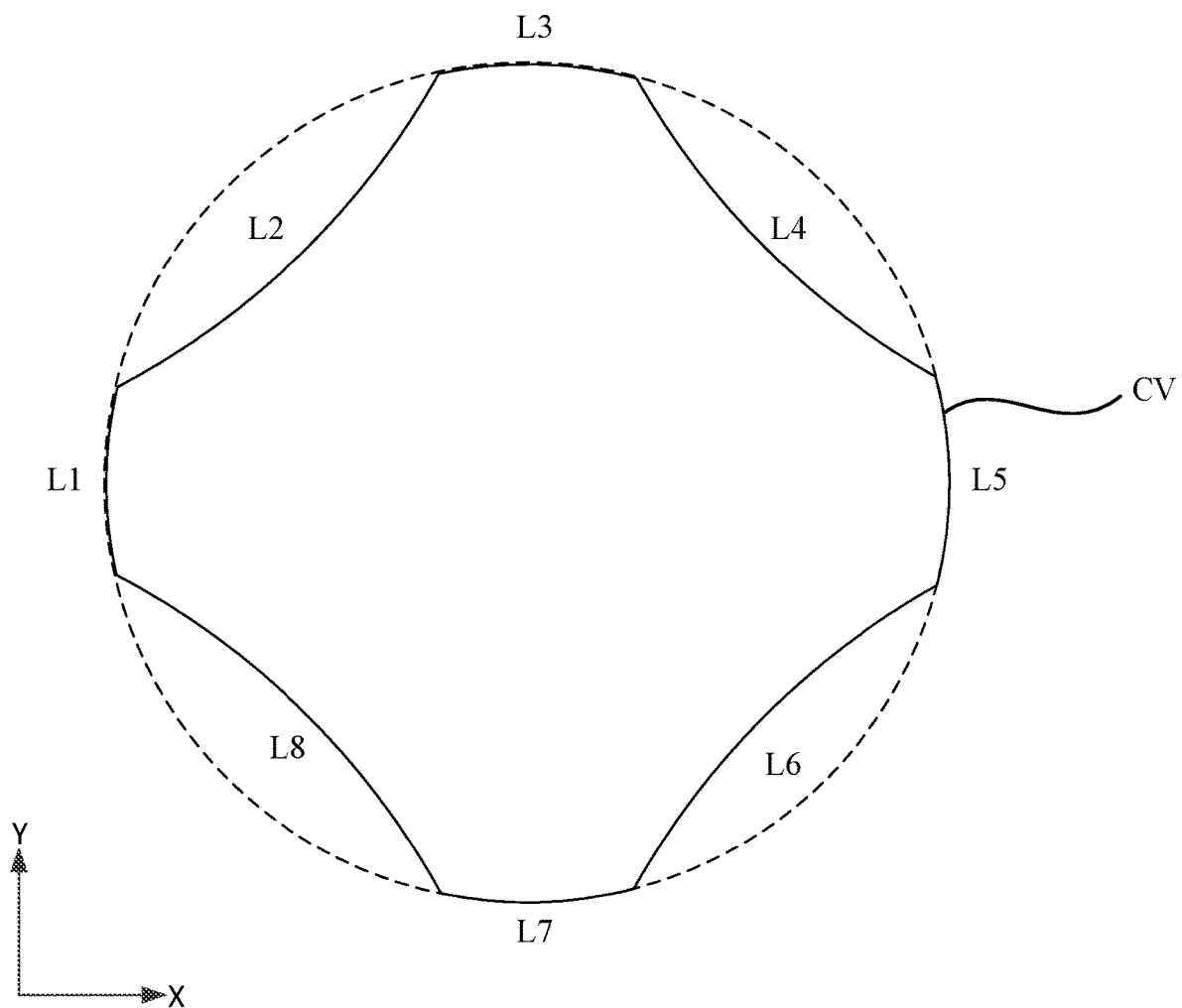
FIG. 12 illustrates an enlarged structural schematic of a light-blocking region shown in FIG. 11.

FIG. 11 illustrates a partial structural top view of another display panel according to the embodiments of the present disclosure, and FIG. 12 illustrates an enlarged structural schematic of a light-blocking region shown in FIG. 11. Referring to FIG. 11 and FIG. 12, the plurality of light-blocking regions A32 may be arranged in rows and columns in the photo-sensitive element disposing region A3. Along the direction perpendicular to the plane of the base substrate 10, the edge contour of the light-blocking region A32 may include a first side L1, a second side L2, a third side L3, a fourth side L4, a fifth side L5, a sixth side L6, a seventh side L7, and an eighth side L8, which are sequentially connected in a head-to-tail manner. The first side L1, the third side L3, the fifth side L5, and the seventh side L7 may all be convex arcs; and the second side L2, the fourth side L4, the sixth side L6, and the eighth side L8 may all be concave arcs. In the embodiments of the present disclosure, the first side L1, the second side L2, the third side L3, the fourth side L4, the fifth side L5, the sixth side L6, the seventh side L7, and the eighth side L8 may all be arcs, which may weaken the diffraction phenomenon. Furthermore, the first side L1, the third side L3, the fifth side L5, and the seventh side L7 may all be convex arcs, that is, the first side L1, the third side L3, the fifth side L5, and the seventh side L7 may all be the first convex arced edges, which may reserve sufficient space for disposing the pixel units 20 in the light-blocking regions A32.

Optionally, referring to FIG. 11 and FIG. 12, the first side L1, the third side L3, the fifth side L5, and the seventh side L7 may have a same curvature. That is, the first side L1, the third side L3, the fifth side L5, and the seventh side L7 may be arcs on a same circle (shown by a dotted line in FIG. 12). The second side L2, the fourth side L4, the sixth side L6, and the eighth side L8 may have a same curvature. The photo-sensitive element disposing region A3 may include a plurality of matrix units A33 which may include the light-blocking regions A32 arranged in a 2×2 matrix. The light-transmitting region A31 may include a plurality of circular sub-light-transmitting regions A311. In a matrix unit A33, one side of each light-blocking region A32 may coincide with the edge of the circular sub-light-transmitting region A311. In the embodiments of the present disclosure, the light-blocking region A32 may at least include the first convex arched edge CV, thereby implementing the reduction of the diffraction phenomenon in the photo-sensing element disposing region A3. Furthermore, the circular sub-light-transmitting region A311 may be formed and surrounded by the light-blocking regions A32 arranged in the 2×2 matrix, and the edge of the circular sub-light-transmitting region A311 may be an circle, which may be advantageous to further reduce or even eliminate the diffraction phenomenon in the photo-sensitive element disposing region A3. It should be noted that the first sub-pixel 21, the second sub-pixel 22, and the third sub-pixel 23 may be arranged in the delta shape in FIG. 11 for illustration, which may not be limited according to the embodiments of the present disclosure.

Figure 13:
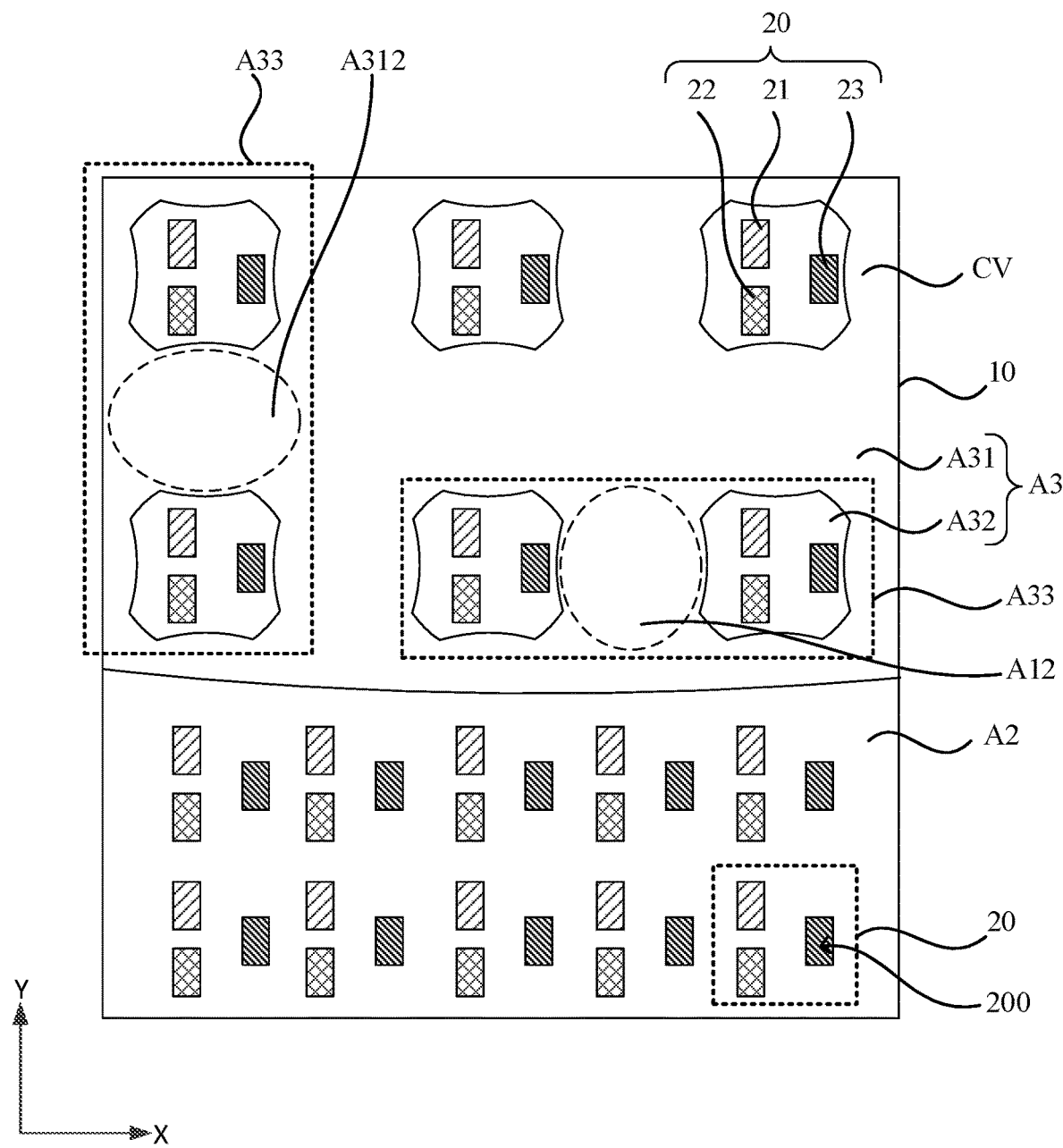
FIG. 13 illustrates a partial structural top view of another display panel according to embodiments of the present disclosure.

FIG. 13 illustrates a partial structural top view of another display panel according to the embodiments of the present disclosure. Referring to FIG. 13, the photo-sensitive element disposing region A3 may include the plurality of matrix units A33 which may include the light-blocking regions A32 arranged in a 1×2 or 2×1 matrix. The light-transmitting region A31 may include a plurality of elliptical sub-light-transmitting regions A312. In a matrix unit A33, one side of each light-blocking region A32 may coincide with the edge of the elliptical sub-light-transmitting region A312. In the embodiments of the present disclosure, the light-blocking region A32 may at least include the first convex arched edge CV, thereby implementing the reduction of the diffraction phenomenon in the photo-sensing element disposing region A3. Furthermore, the elliptical sub-light-transmitting region A312 may be formed and surrounded by the light-blocking regions A32 arranged in the 1×2 or 2×1 matrix, and the edge of the circular sub-light-transmitting region A312 may be an ellipse, which may be advantageous to further reduce or even eliminate the diffraction phenomenon in the photo-sensitive element disposing region A3. It should be noted that the first sub-pixel 21, the second sub-pixel 22, and the third sub-pixel 23 may be arranged in the delta shape in FIG. 13 for illustration, which may not be limited according to the embodiments of the present disclosure.

Figure 14:
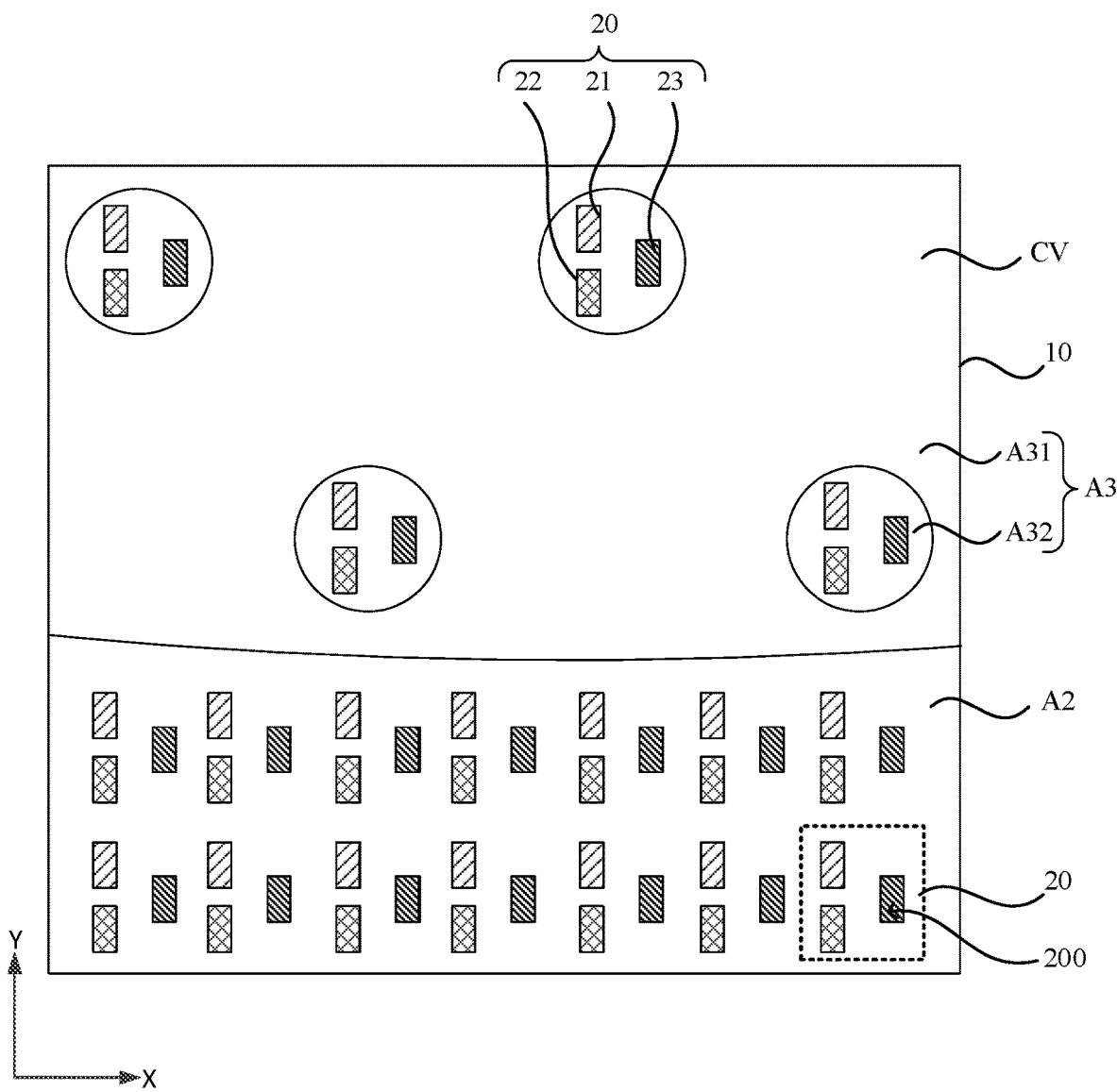
FIG. 14 illustrates a partial structural top view of another display panel according to embodiments of the present disclosure.

FIG. 14 illustrates a partial structural top view of another display panel according to the embodiments of the present disclosure. Referring to FIG. 14, the plurality of light-blocking regions A32 may be arranged in rows and columns in the photo-sensitive element disposing region A3, where the light-blocking regions A32 in odd rows and the light-blocking regions A32 in even rows may be staggeredly arranged. In the embodiments of the present disclosure, since the light-blocking regions A32 in odd rows and the light-blocking regions A32 in even rows may be staggeredly arranged, the distance between two adjacent light-blocking regions A32 along the X direction may be increased, and the quantity of the light-blocking regions A32 in each row may be reduced, thereby reducing the area of the light-blocking regions A32, increasing the area of the light-transmitting region A31, and increasing the amount of external ambient light passing through the light-transmitting region A31. It should be noted that, in other embodiments, the plurality of light-blocking regions A32 may be arranged in a matrix in the photo-sensitive element disposing region A3, which may not be limited according to the embodiments of the present disclosure.

Figure 15:
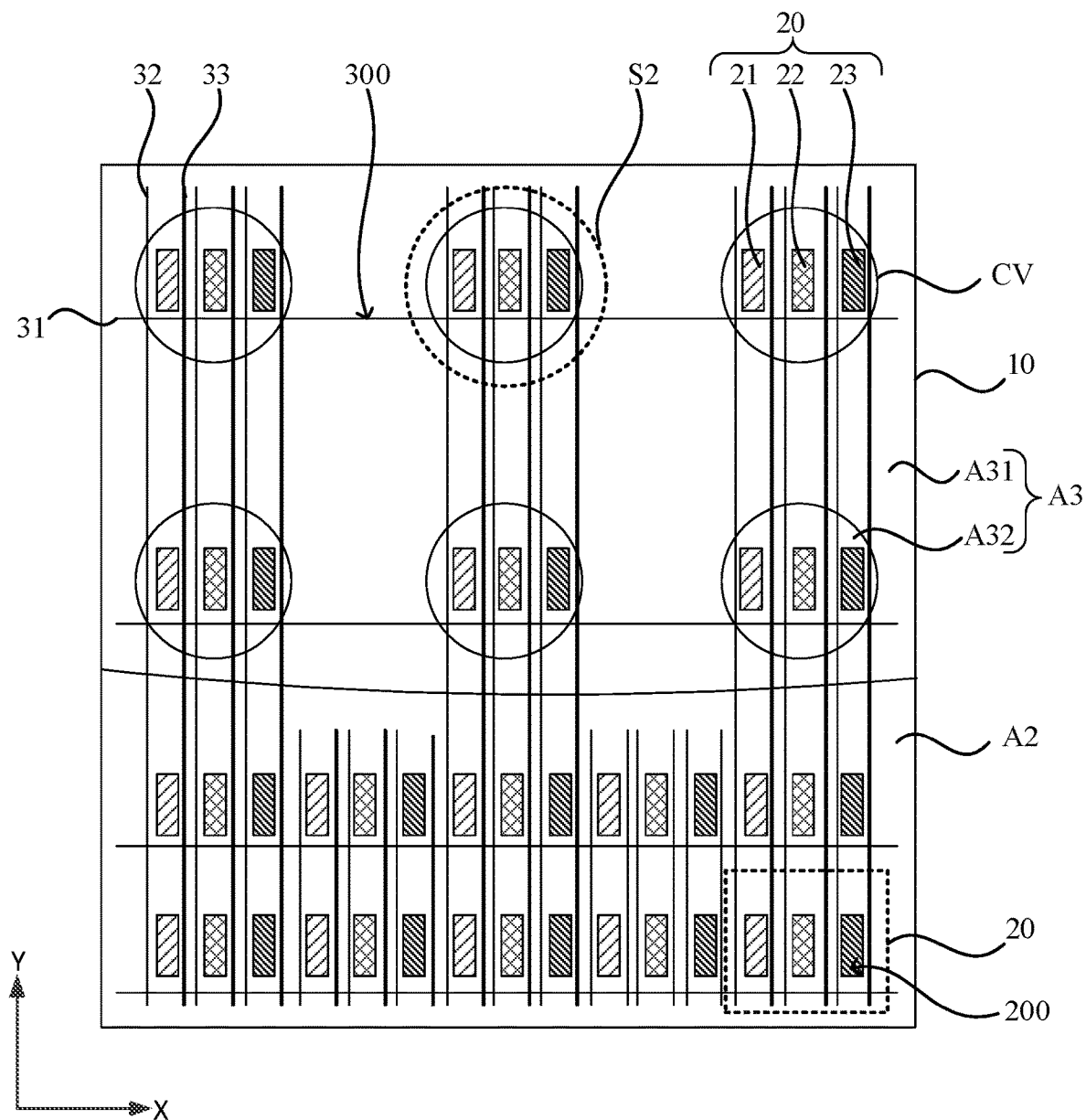
FIG. 15 illustrates a partial structural top view of another display panel according to embodiments of the present disclosure.
Figure 16:
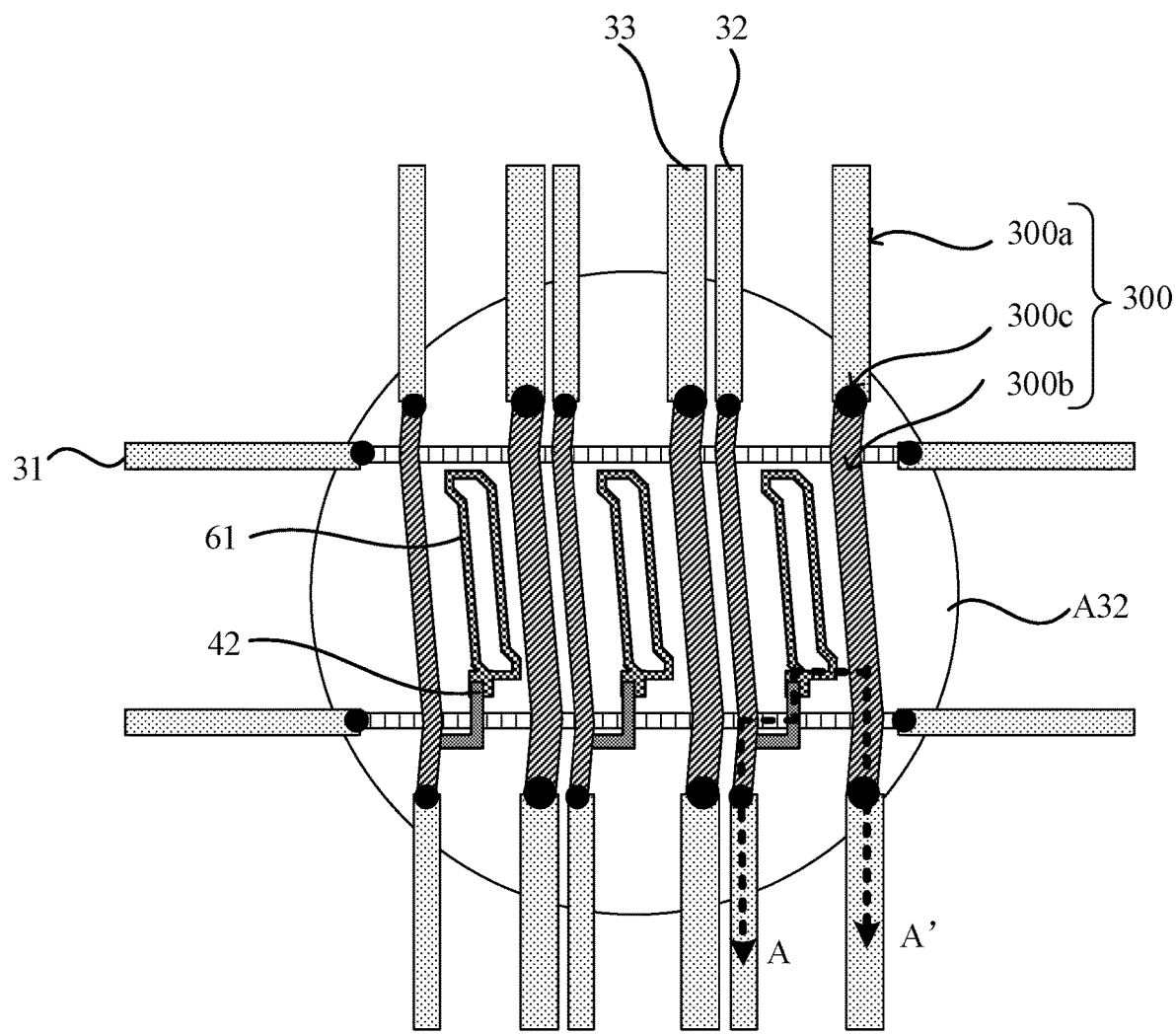
FIG. 16 illustrates an enlarged structural schematic of a region S2 in FIG. 15.
Figure 17:
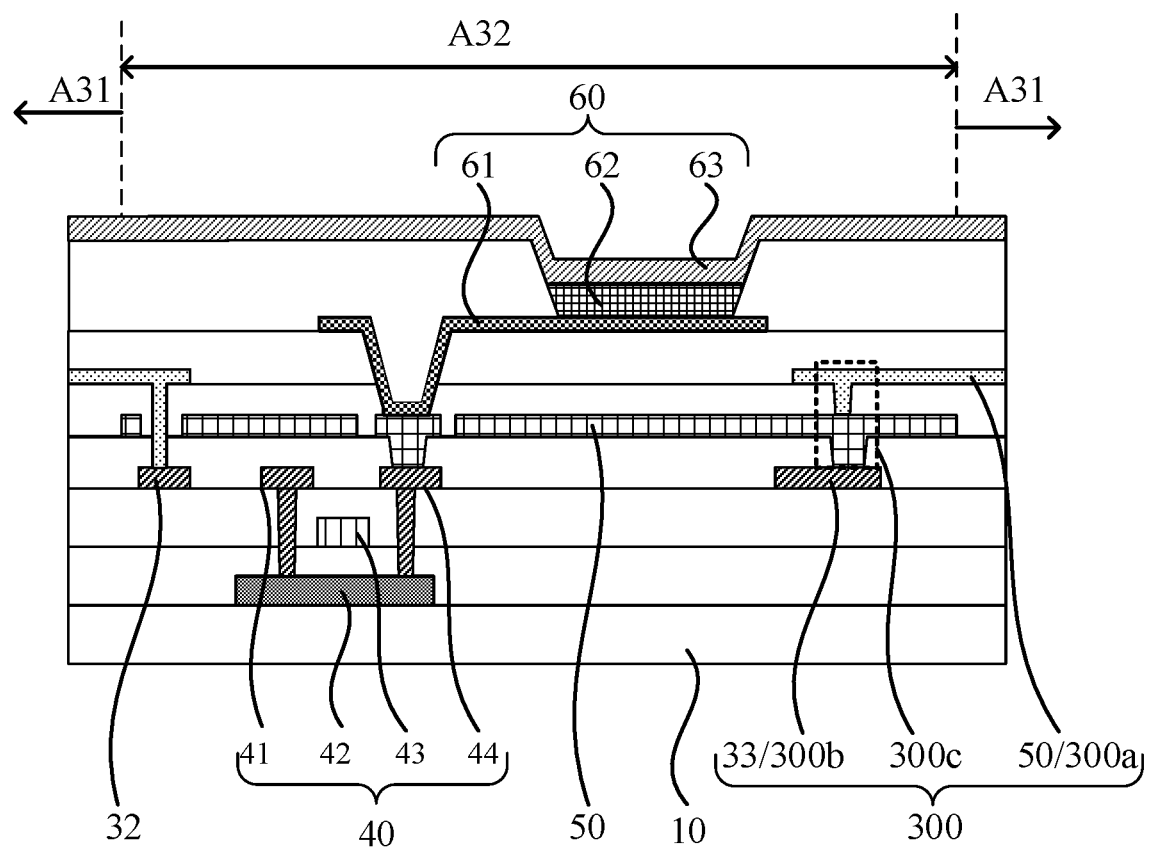
FIG. 17 illustrates a cross-sectional structural schematic along a cross-sectional line AA' in FIG. 16.

FIG. 15 illustrates a partial structural top view of another display panel according to the embodiments of the present disclosure; FIG. 16 illustrates an enlarged structural schematic along a region S2 in FIG. 15; and FIG. 17 illustrates a cross-sectional structural schematic along a cross-sectional line AA' in FIG. 16. Referring to FIGS. 15-17, the light-blocking region A32 may include a light-blocking structure 50, and the sub-pixel 200 may include a light-emitting unit 60. The display panel may further include a pixel drive circuit 40 which is electrically connected to the light-emitting unit 60, and the pixel drive circuit 40 may be between the light-emitting unit 60 and the base substrate 10. The light-blocking structure 50 may be between the light-emitting unit 60 and the pixel drive circuit 40. In other embodiments, the light-blocking structure 50 may also be between the base substrate 10 and the pixel drive circuit 40.

Referring to FIG. 17, the light-blocking structure 50 may be between the light-emitting unit 60 and the pixel drive circuit 40, and the vertical projection of the light-emitting unit 60 onto the base substrate 10 may be within the vertical projection of the light-blocking structure 50 onto the base substrate 10. The pixel drive circuit 40 may include a thin-film transistor, and the thin-film transistor may include a source electrode 41, a semiconductor layer 42, a gate electrode 43, and a drain electrode 44. The light-emitting unit 60 may include a first electrode 61 (an anode), an (organic) light-emitting functional layer 62, and a second electrode 63 (a cathode). The light-emitting functional layer 62 may be between the first electrode 61 and the second electrode 63, and the first electrode 61 may be electrically connected to the drain electrode 44.

Optionally, referring to FIGS. 15-17, the light-blocking region A32 may include the light-blocking structure 50. The display panel may further include a plurality of signal lines 300. The plurality of signal lines 300 may at least include a plurality of power supply signal lines 33. The light-blocking structure 50 may be electrically connected to a power supply signal line 33. In the embodiments of the present disclosure, the light-blocking structure 50 may be made of a metal material and electrically connected to the power supply signal line 33. Therefore, a stable potential may be provided to the light-blocking structure 50 through the power supply signal line 33 to prevent the light-blocking structure 50 from floating; and the electrical influence of the light-blocking structure 50 on the original structure of the display panel may be reduced or even eliminated. For example, the electrical influence of the light-blocking structure 50 on the first electrode 61 may be reduced or even eliminated. Furthermore, the light-blocking structure 50 may be electrically connected to the power supply signal line 33, and may be connected in parallel with the power supply signal line 33, which may reduce the voltage drop of the power supply voltage on the power supply signal line 33, thereby ensuring the light emitting uniformity of the display panel.

Optionally, referring to FIGS. 15-17, the display panel may further include the plurality of signal lines 300 and the pixel drive circuit 40. The signal line 300 may be electrically connected to the pixel drive circuit 40. The signal lines 300 may include a first signal line 300*a* in the light-transmitting region A31 which may be made of a transparent conductive material. In the embodiments of the present disclosure, the first signal line 300*a* in the light-transmitting region A31 may be made of the transparent conductive material and have a relatively high transmittance, and the transmittance different between a position in the light-transmitting region A31 where the first signal line 300*a* is located and a position in the light-transmitting region A31 without the first signal line 300*a* may be small. Therefore, the diffraction caused by the plurality of signal lines 300 may be reduced and even eliminated, thereby further reducing the diffraction phenomenon in the photo-sensitive element disposing region A3. In addition, the first signal line 300*a* in the light-transmitting region A31 may be made of a transparent conductive material, which may further improve the overall transmittance of the photo-sensitive element disposing region A3.

Referring to FIGS. 15-17, the first signal line 300*a* may be made of a transparent conductive material. The transmittance of the transparent conductive material may be greater than or equal to 85%. The transparent conductive material may include, for example, indium tin oxide or indium zinc oxide.

Optionally, referring to FIGS. 15-17, the signal line 300 may further include a second signal line 300*b* in the light-blocking region A32, and the second signal line 300b may be made of a metal material. The connection point 300c of the first signal line 300a and the second signal line 300b may be in the light-blocking region A32. In the embodiments of the present disclosure, since the second signal line 300b is in the light-blocking region A32, external ambient light irradiating onto the second signal line 300b may be blocked by the light-blocking region A32, the second signal line 300b may not cause diffraction problems, and the transmittance of the second signal line 300b may not affect the transmittance of the photo-sensitive element disposing region A3. Therefore, the second signal line 300b may be made of a metal material to reduce the resistance of the signal line 300. Furthermore, the connection point 300c of the first signal line 300a and the second signal line 300b may be in the light-blocking region A32, and external ambient light irradiating onto the second signal line 300b may be blocked by the light-blocking region A32, so that the connection point 300c may not cause diffraction. It should be noted that, in the embodiment of the present disclosure, the signal line 300 may be used as the power supply signal line 33 for illustration, which may not be limited according to the embodiments of the present disclosure.

Referring to FIG. 15, the plurality of signal lines 300 may further include scan lines 31 and data lines 32. A plurality of scan lines 31 may extend along the X direction and be arranged along the Y direction. A plurality of data lines 32 may extend along the Y direction and be arranged along the X direction. The plurality of signal lines 300 may further include a reference voltage supply signal line (not shown in FIG. 15), and the like, which may not be limited according to the embodiments of the present disclosure.

Referring to FIG. 16, for a same signal line 300, the line width of the first signal line 300a may be greater than the line width of the second signal line 300b. Since the first signal line 300a is made of a transparent conductive material, the second signal line 300b may be made of a metal material. The conductivity of the transparent conductive material may be relatively poor, and the conductivity of the metal material may be relatively desirable. For the same signal line 300, the line width of the first signal line 300a may be greater than the line width of the second signal line 300b, which may balance the conductivity of the first signal line 300a and the second signal line 300b to optimize the conductivity of the entire signal line 300.

Referring to FIG. 17, both the light-blocking structure 50 and the first signal line 300a may be between the light-emitting unit 60 and the pixel drive circuit 40. The light-blocking structure 50 may be between the first signal line 300a and the pixel drive circuit 40. The first signal line 300a may be electrically connected to the light-blocking structure 50 through a first via; and the light-blocking structure 50 may be electrically connected to the second signal line 300b through a second via. The first via and the second via may form the connection point 300c of the first signal line 300a and the second signal line 300b. In other embodiments, the first signal line 300a may be between the light-blocking structure 50 and the pixel drive circuit 40.

Referring to FIG. 17, the light-blocking structure 50 may be between the light-emitting unit 60 and the pixel drive circuit 40. The power supply signal line 33 may be on a same layer as the source electrode 41 and the drain electrode 44. The light-blocking structure 50 may be electrically connected to the power supply signal line 33 through the second via.

Figure 18:
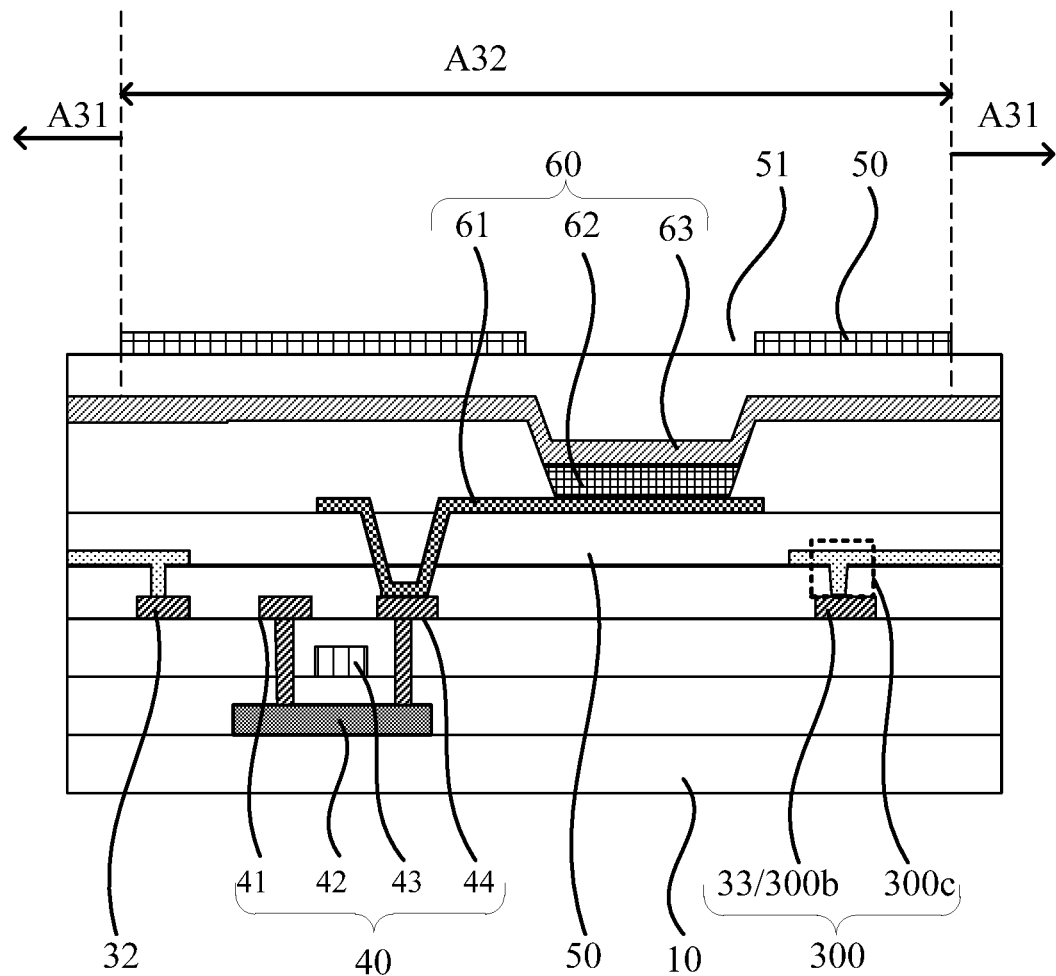
FIG. 18 illustrates a partial structural top view of another display panel according to embodiments of the present disclosure.

FIG. 18 illustrates a partial structural top view of another display panel according to the embodiments of the present disclosure. Referring to FIG. 18, the light-blocking region A32 may include the light-blocking structure 50, and the sub-pixel 200 may include the light-emitting unit 60. The display panel may further include the pixel drive circuit 40 which may be electrically connected to the light-emitting unit 60. The pixel drive circuit 40 may be between the light-emitting unit 60 and the base substrate 10. The light-blocking structure 50 may be on a side of the light-emitting unit 60 away from the base substrate 10. The light-blocking structure 50 may include an opening 51, and the opening 51 may expose the light-emitting unit 60. In the embodiments of the present disclosure, the light-blocking structure 50 may be on the side of the light-emitting unit 60 away from the base substrate 10, the opening 51 may expose the light-emitting unit 60, and the light emitted from the light-emitting unit 60 may exit the outside of the display panel through the opening 51 of the light-blocking structure 50. Therefore, the light-blocking structure 50 may not affect the light-emitting display function of the display panel.

Referring to FIG. 18, the light-emitting unit 60 may include the first electrode 61 (the anode), the (organic) light-emitting functional layer 62, and the second electrode 63 (the cathode). The light-emitting functional layer 62 may be between the first electrode 61 and the second electrode 63, and the first electrode 61 may be a reflective electrode. The vertical projection of the opening 51 on the base substrate 10 may be within the vertical projection of the first electrode 61 on the base substrate 10. When external ambient light irradiates onto the photo-sensitive element disposing region A3, the light-blocking structure 50 and the first electrode 61 may block the external ambient light, thus the external ambient light may be prevented from passing through the light-blocking region A32 and irradiating onto the backlight side of the display panel. Therefore, the external ambient light may be prevented from passing through the light-blocking region A32 and irradiating onto the elements including the light-emitting unit 60, the pixel drive circuit 40 and the like in the light-blocking region A32, which may prevent the diffraction by the elements in the light-blocking region A32.

Figure 19:
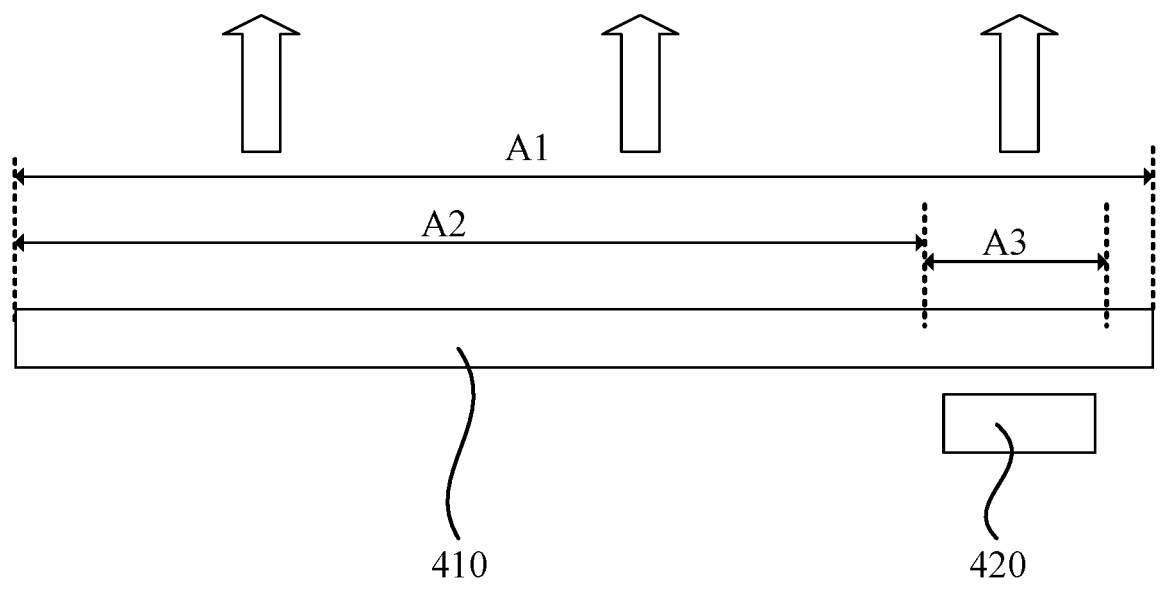
FIG. 19 illustrates a structural schematic of a display device according to embodiments of the present disclosure.

The embodiments of the present disclosure further provide a display device. FIG. 19 illustrates a structural schematic of a display device according to the embodiments of the present disclosure. As shown in FIG. 19, the display device provided by the embodiments of the present disclosure may include a display panel 410 and a photo-sensitive element 420 at the photo-sensitive element disposing region A3 according to any embodiments of the present disclosure. The photo-sensitive element 420 may be on the backlight side of the display panel, that is, the photo-sensitive element 420 may be on a side away from the light-emitting display side (an arrow direction in FIG. 19 may indicate the light-emitting direction of the display panel 410) of the display panel 410. The photo-sensitive element 420 may be an optical device or a photoelectric device, such as a camera, an infrared sensor, and the like. After passing through the photo-sensitive element disposing region A3 of the display panel, the external ambient light may reach the photo-sensitive element 420, thereby implementing functions such as capturing, and the like. The display device provided by the embodiments of the present invention may be a mobile phone, a computer, a television, a smart wearable device, and the like, which may not be limited according to the embodiments of the present disclosure.

From the above-mentioned embodiments, it can be noted that the display panel and the display device provided by the present disclosure may achieve at least the following beneficial effects.

In the display panel provided by the embodiments of the present disclosure, since the pixel units in the photo-sensitive element disposing region are in the light-blocking region, the light irradiated to a gap between two adjacent sub-pixels may be blocked when external ambient light is irradiated onto the photo-sensitive element disposing region, thereby preventing diffraction at the gap between two adjacent subpixels. Furthermore, the light-blocking region may at least include the first outer convex curved edge, that is, a portion of the outer edge of the light-blocking region may be convex-curved. It may be understood that, if a boundary between the light-blocking region and the light-transmitting region is a straight line, the light energy may be distributed on two sides of the straight line to form a plurality of light and dark stripes in parallel with the extending direction of the straight line. If the boundary between the light-blocking region and the light-transmitting region is an arc, the arc may be equivalent to a plurality of straight lines with different extending directions. Therefore, the light energy may be distributed in a plurality of different directions, thereby weakening the diffraction phenomenon. In the embodiments of the present disclosure, the light-blocking region may at least include the first convex arced edge, thereby reducing the diffraction phenomenon of the photo-sensitive element disposing region. Furthermore, the first convex arced edge may also reserve sufficient space for disposing the pixel units at the light-blocking region, thereby facilitating the disposing of the pixel units at the light-blocking region.

It should be noted that the above-mentioned description may merely be the embodiments of the present disclosure and the applied technical principles. Those skilled in the art should understand that the present disclosure may not be limited to the embodiments described herein. For those skilled in the art, various obvious changes, readjustments, combinations and substitutions may be made without departing from the scope of protection of the present disclosure. Therefore, although the present disclosure has been described in detail through the above-mentioned embodiments, the present disclosure may not be limited to the above-mentioned embodiments. Without departing from the concept of the disclosure, a variety of other equivalent embodiments may be included, and the scope of the disclosure may be determined by the scope of the appended claims.

What is claimed is:

1. A display panel, comprising:
a display region, including a first display region and a photo-sensitive element disposing region, wherein the photo-sensitive element disposing region includes a light-transmitting region and a light-blocking region;
a base substrate; and
a plurality of pixel units on the base substrate, wherein the light-blocking region includes at least one of the plurality of pixel units, and one of the plurality of pixel units includes a plurality of sub-pixels, wherein:
along a direction perpendicular to a plane of the base substrate, an interface edge between the light-transmitting region and the light-blocking region at least includes a first convex arced edge,
a plurality of light-blocking regions is arranged in rows and columns in the photo-sensitive element disposing region,
along the direction perpendicular to the plane of the base substrate, an edge contour of the light-blocking region includes a first side, a second side, a third side, a fourth side, a fifth side, a sixth side, a seventh side, and an eighth side, which are sequentially connected in a head-to-tail manner,
the first side, the third side, the fifth side, and the seventh side are all convex arcs,
and the second side, the fourth side, the sixth side, and the eighth side are all concave arcs,
the photo-sensitive element disposing region includes a plurality of matrix units which includes the light-blocking regions arranged in a 1×2 or 2×1 matrix, and
the light-transmitting region includes a plurality of elliptical sub-light-transmitting regions, and in a matrix unit, one side of each light-blocking region coincides with an edge of an elliptical sub-light-transmitting region.

2. The panel according to claim 1, wherein:
one pixel unit is disposed in each light-blocking region.

3. The panel according to claim 1, wherein:
the plurality of pixel units is arranged in rows and columns in the photo-sensitive element disposing region; and
in the light-blocking region, a pixel unit of the plurality of pixel unit includes a first sub-pixel, a second sub-pixel, and a third sub-pixel, which are arranged in a delta shape.

4. The panel according to claim 3, wherein:
in a same pixel unit, the first sub-pixel and the second sub-pixel are in a same column, and the first sub-pixel and the third sub-pixel are in different columns.

5. The panel according to claim 3, wherein:
sub-pixels in odd rows and sub-pixels in even rows are staggeredly arranged in the display region; and
in a same pixel unit, the first sub-pixel and the second sub-pixel are in a same row, and the first sub-pixel and the third sub-pixel are in different rows.

6. The panel according to claim 5, wherein:
in the photo-sensitive element disposing region, third sub-pixels in different pixel units are disposed in a same row.

7. The panel according to claim 1, wherein:
the plurality of pixel units is arranged in rows and columns in the photo-sensitive element disposing region; and
in the light-blocking region, a pixel unit of the plurality of pixel unit includes a first sub-pixel, a second sub-pixel, and a third sub-pixel, which are arranged along a row direction.

8. The panel according to claim 7, wherein:
along the direction perpendicular to the plane of the base substrate, an edge contour of the light-blocking region has a shape including an ellipse, and a major axis of the ellipse is in parallel with a row direction.

9. The panel according to claim 1, wherein:
the plurality of pixel units is arranged in rows and columns in the photo-sensitive element disposing region;
in the light-blocking region, a pixel unit of the plurality of pixel unit includes a first sub-pixel, a second sub-pixel, a third sub-pixel, and a fourth sub-pixel; and
in a same pixel unit, the first sub-pixel and the third sub-pixel are in a same row; any two of the first sub-pixel, the second sub-pixel, and the fourth sub-pixel are in different rows; the second sub-pixel and the fourth sub-pixel are in a same column; and any two of the first sub-pixel, the second sub-pixel, and the third sub-pixel are in different columns.

10. The panel according to claim 1, wherein:
the light-blocking regions in odd rows and the light-blocking regions in even rows are staggeredly arranged.

11. The panel according to claim 1, wherein:
along a row direction and a column direction, a distance between geometric centers of two adjacent light-blocking regions is D; and
along the direction perpendicular to the plane of the base substrate, an edge contour of the light-blocking region is a circle, and a radius of the circle is R, wherein R and D satisfy 0<2R<D<6R.

12. The panel according to claim 1, wherein:
the light-blocking region includes a light-blocking structure, and a sub-pixel includes a light-emitting unit;
the display panel further includes a pixel drive circuit which is electrically connected to the light-emitting unit and is between the light-emitting unit and the base substrate; and
the light-blocking structure is between the base substrate and the pixel drive circuit or between the light-emitting unit and the pixel drive circuit.

13. The panel according to claim 1, wherein:
the light-blocking region includes a light-blocking structure, and a sub-pixel includes a light-emitting unit;
the display panel further includes a pixel drive circuit which is electrically connected to the light-emitting unit and is between the light-emitting unit and the base substrate; and
the light-blocking structure is on a side of the light-emitting unit away from the base substrate, and the light-blocking structure includes an opening which exposes the light-emitting unit.

14. The panel according to claim 1, wherein:
the light-blocking region includes a light-blocking structure;
the display panel further includes a plurality of signal lines, and the plurality of signal lines at least includes a plurality of power supply signal lines; and
the light-blocking structure is electrically connected to a power supply signal line.

15. A display panel, comprising:
a display region, including a first display region and a photo-sensitive element disposing region, wherein the photo-sensitive element disposing region includes a light-transmitting region and a light-blocking region;
a base substrate; and
a plurality of pixel units on the base substrate, wherein the light-blocking region includes at least one of the plurality of pixel units, and one of the plurality of pixel units includes a plurality of sub-pixels, wherein:
along a direction perpendicular to a plane of the base substrate, an interface edge between the light-transmitting region and the light-blocking region at least includes a first convex arced edge,
a plurality of light-blocking regions is arranged in rows and columns in the photo-sensitive element disposing region,
along the direction perpendicular to the plane of the base substrate, an edge contour of the light-blocking region includes a first side, a second side, a third side, a fourth side, a fifth side, a sixth side, a seventh side, and an eighth side, which are sequentially connected in a head-to-tail manner,
the first side, the third side, the fifth side, and the seventh side are all convex arcs, and
the second side, the fourth side, the sixth side, and the eighth side are all concave arcs,
the first side, the third side, the fifth side, and the seventh side have a same curvature; the second side, the fourth side, the sixth side, and the eighth side have a same curvature; the photo-sensitive element disposing region includes a plurality of matrix units which includes the light-blocking regions arranged in a 2×2 matrix;
and the light-transmitting region includes a plurality of circular sub-light-transmitting regions, and in a matrix unit, one side of each light-blocking region coincides with an edge of a circular sub-light-transmitting region.

16. A display device, comprising:
a display panel, comprising:
a display region, including a first display region and a photo-sensitive element disposing region, wherein the photo-sensitive element disposing region includes a light-transmitting region and a light-blocking region;
a base substrate; and
a plurality of pixel units on the base substrate, wherein the light-blocking region includes at least one of the plurality of pixel units, and one of the plurality of pixel units includes a plurality of sub-pixels, wherein:
along a direction perpendicular to a plane of the base substrate, an interface edge between the light-transmitting region and the light-blocking region at least includes a first convex arced edge,
a plurality of light-blocking regions is arranged in rows and columns in the photo-sensitive element disposing region,
along the direction perpendicular to the plane of the base substrate, an edge contour of the light-blocking region includes a first side, a second side, a third side, a fourth side, a fifth side, a sixth side, a seventh side, and an eighth side, which are sequentially connected in a head-to-tail manner,
the first side, the third side, the fifth side, and the seventh side are all convex arcs, and
the second side, the fourth side, the sixth side, and the eighth side are all concave arcs,
the photo-sensitive element disposing region includes a plurality of matrix units which includes the light-blocking regions arranged in a 1×2 or 2×1 matrix, and
the light-transmitting region includes a plurality of elliptical sub-light-transmitting regions, and in a matrix unit, one side of each light-blocking region coincides with an edge of an elliptical sub-light-transmitting region; and
a photo-sensitive element at the photo-sensitive element disposing region, wherein the photo-sensitive element is on a backlight side of the display panel.

* * * * *